United States Patent
Crane, Jr. et al.

(10) Patent No.: US 6,803,650 B2
(45) Date of Patent: Oct. 12, 2004

(54) SEMICONDUCTOR DIE PACKAGE HAVING MESH POWER AND GROUND PLANES

(75) Inventors: Stanford W. Crane, Jr., Santa Clara, CA (US); Myoung-soo Jeon, Fremont, CA (US); Charley Takeshi Ogata, San Jose, CA (US); Ton-Yong Wang, Fremont, CA (US); Andreas C. Cangellaris, Champaign, IL (US); Jose Schutt-Aine, Savoy, IL (US)

(73) Assignee: Silicon Bandwidth Inc., San Jose, CA (US)

( * ) Notice: Subject to any disclaimer, the term of this patent is extended or adjusted under 35 U.S.C. 154(b) by 0 days.

(21) Appl. No.: 09/867,438

(22) Filed: May 31, 2001

(65) Prior Publication Data

US 2002/0117751 A1 Aug. 29, 2002

Related U.S. Application Data

(60) Provisional application No. 60/270,635, filed on Feb. 23, 2001.

(51) Int. Cl.⁷ .............................................. H01L 23/48

(52) U.S. Cl. ...................... 257/697; 257/691; 257/738; 257/780

(58) Field of Search ................................ 257/697, 691, 257/738, 780

(56) References Cited

U.S. PATENT DOCUMENTS

| | | | |
|---|---|---|---|
| 4,819,131 A | 4/1989 | Watari | 361/414 |
| 5,306,948 A | 4/1994 | Yamada et al. | 257/690 |
| 5,307,012 A | 4/1994 | Bhattacharyya et al. | 324/158 F |
| 5,541,449 A | 7/1996 | Crane, Jr. et al. | 257/697 |
| 6,040,702 A | 3/2000 | Hembree et al. | 324/755 |

*Primary Examiner*—Luan Thai
(74) *Attorney, Agent, or Firm*—Morgan, Lewis & Bockius LLP

(57) ABSTRACT

A cluster grid array semiconductor die package and mating socket provide electrical connection between one or more semiconductor dies housed within the die package and substrate, such as a printed circuit board, on which the mating socket is mounted. The die package and the mating socket may be easily connected and disconnected. The die package may include power and ground planes built into and distributed within the housing of the die package.

26 Claims, 23 Drawing Sheets

SEMICONDUCTOR DIE PACKAGE HAVING MESH POWER AND GROUND PLANES

This application claims the benefit of priority based on provisional Application No. 60/270,635, filed on Feb. 23, 2001, and incorporated herein by reference.

BACKGROUND OF THE INVENTION

1. Field of the Invention

The present invention relates to a semiconductor die package having mesh power and ground planes and a method for manufacturing such a die package.

2. Description of the Related Art

A semiconductor die or chip is an electrical component on which a microcircuit is built. The microcircuits can be interconnected together on the printed circuit board to form larger electronic circuits for use in radios, televisions, compact disc players, and computers, to name just a few. Because the semiconductor die is fragile, it is encased in a semiconductor die package to protect it from the environment. If one were to look inside an electronic device, such as a computer, compact disc player, or cell phone, one would see one or more printed circuit boards on which semiconductor die packages are mounted and electrically interconnected.

The semiconductor die package includes a housing that holds the semiconductor die and conductive leads or pins that extend from the bottom or sides of the housing. The conductive leads are electrically connected to the semiconductor die within the housing. The outside ends of the leads are typically connected to conductive paths on the printed circuit board or plugged into a socket on the printed circuit board. This secures the semiconductor die package to the printed circuit board and permits electrical signals to pass between the semiconductor die and other components on the printed circuit board.

The integrated circuits built on semiconductor dies are becoming increasingly powerful. As processing power has increased, the number of inputs and outputs between semiconductor dies and other circuit components has increased as well and is expected to increase further. Die packages must provide a larger number of leads or pins without significantly increasing the size of the package. In addition, semiconductor devices are being designed with lower operating power voltages in order to reduce size and power consumption. Notwithstanding lower power consumption, thermal performance remains an important factor in package design. As the operating power is lowered and device speeds increase, signal integrity has become increasingly important concern. For example, in device operation, fluctuations in power and ground voltages should be limited. Large fluctuations in power and ground are not only inefficient, but may cause erroneous operation and may even damage the integrated circuitry on the die. Moreover, parasitic inductances should be reduced to facilitate high-speed operation. Accordingly, there is a need for packages that are inexpensive, that can accommodate a large number of inputs and outputs, and that can support high speed, low power operation.

SUMMARY OF THE INVENTION

The present invention has been made in view of the above circumstances and has as an object to provide an economical, compact die package having large number of inputs and outputs.

A further object is to provide an economical, compact die package and mating socket having large number of inputs and outputs that may mounted be to a substrate, such as a printed circuit board.

A further object is to provide a die package having stable power and ground planes.

A further object is to provide a die package having cost effective power and ground planes.

A further object is to provide a die package having easily configurable power and ground planes.

A further object to provide an economical die package having stable power and ground planes and a mating socket that may mounted be to a substrate, such as a printed circuit board.

A further object of the invention is to provide a sturdy and reliable die package having a large number of inputs and outputs and stable power and ground planes.

A further object of the invention is to provide an improved power and ground plane arrangement that may be used with a die package, with a mating socket, or with a substrate.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiment(s) of the invention and together with the description, serve to explain the principles of the invention.

DESCRIPTION OF THE PREFERRED EMBODIMENT

Reference will now be made in detail to the present exemplary embodiment(s) of the invention illustrated in the accompanying drawings. Wherever possible, the same reference numbers will be used throughout the drawings to refer to the same or like parts.

Figure 1:
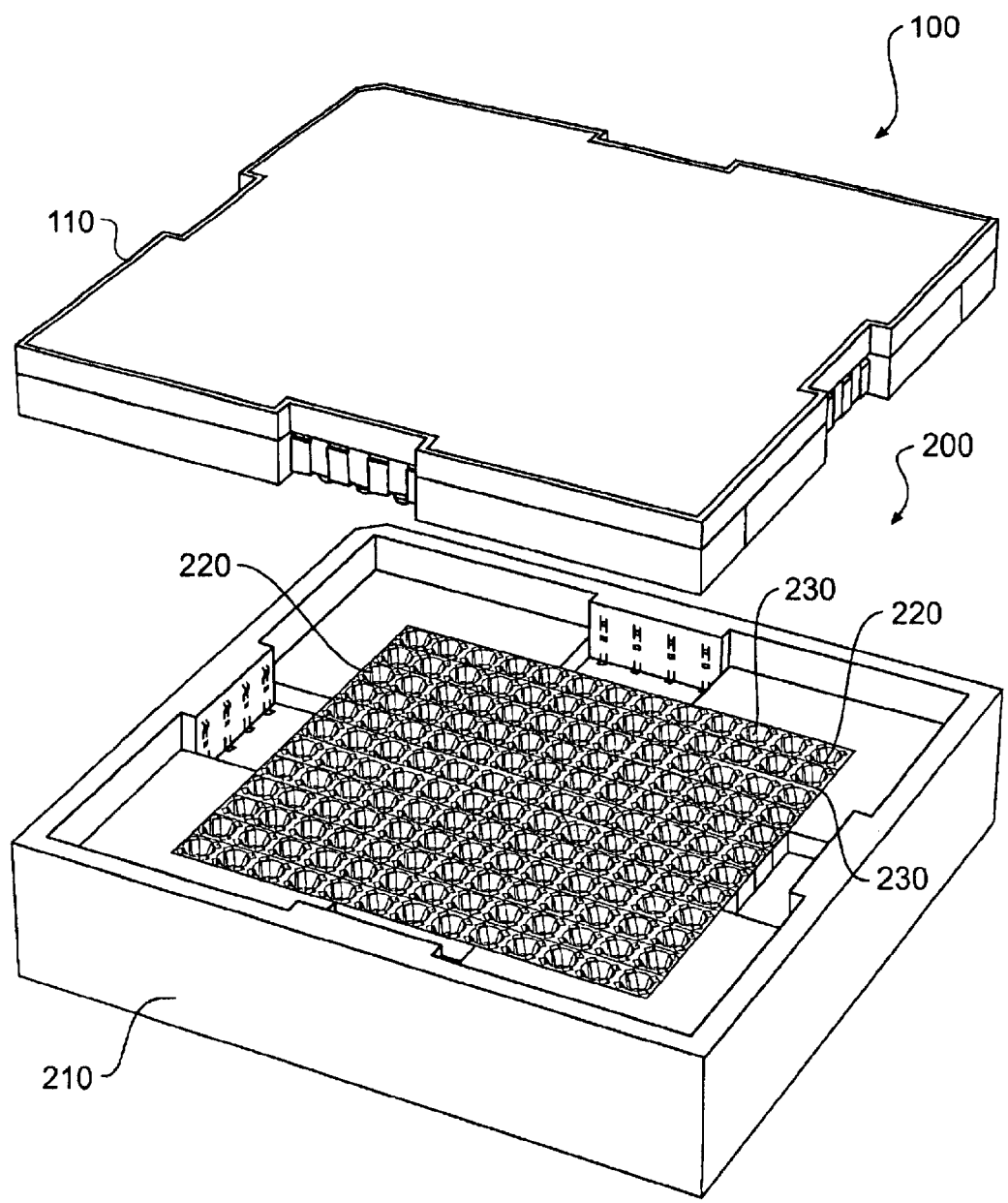
FIGS. 1 and 2 provide perspective views of an illustrative embodiment of a cluster grid array die package and mating socket in accordance with the present invention.
Figure 2:
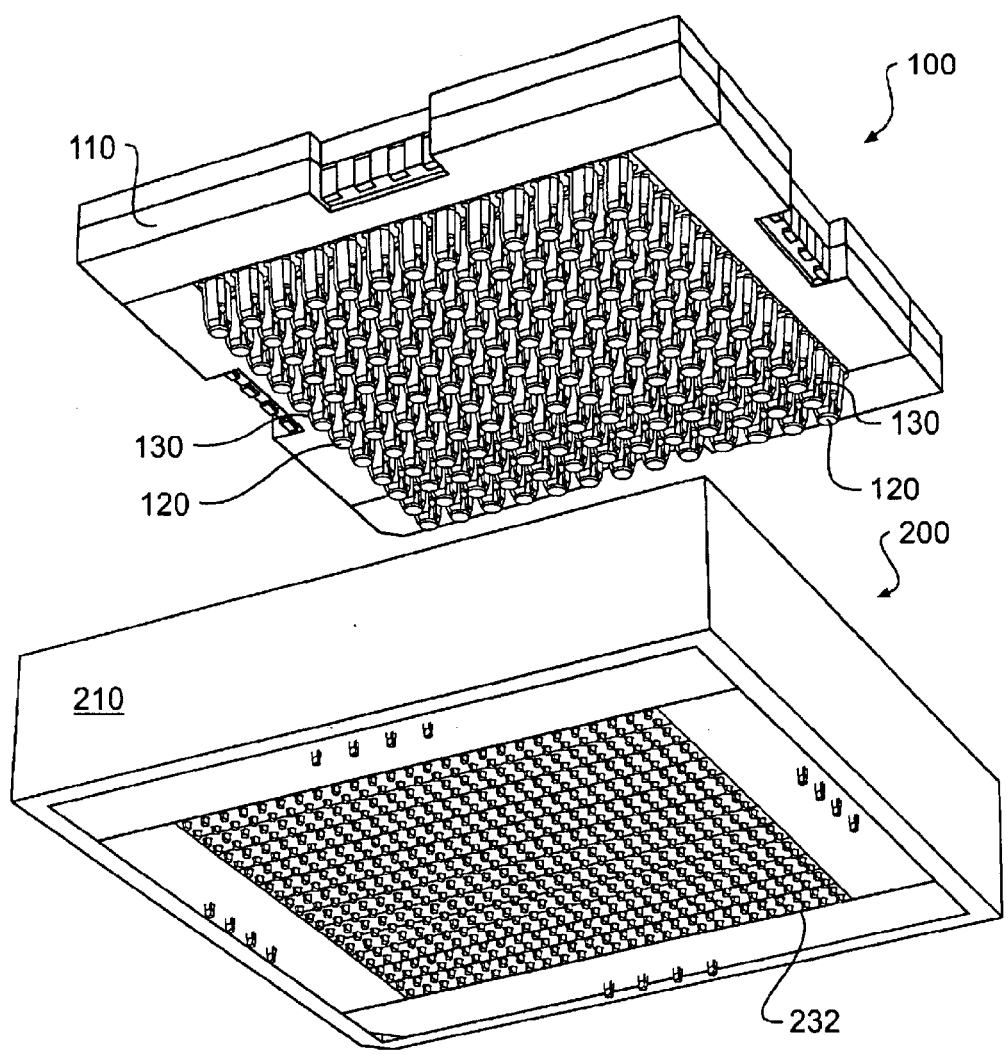

FIGS. 1 and 2 illustrate an exemplary embodiment of a cluster grid array semiconductor die package 100 and a mating socket 200 in accordance with the present invention. The die package 100 includes a housing 110 that houses at least one semiconductor die. As shown in FIG. 2, a plurality of posts 120 extend from a bottom surface of the housing 110. Package pins 130 extend along the posts 120 and provide electrical paths from an interior to an exterior of housing 110. The mating socket 200 includes housing 210 having a plurality of sockets 220 in a top surface. A plurality of socket contacts or beams 230 are arranged within the sockets 200 as shown in FIG. 1. The socket beams 230 include ends 232 that extend from a bottom surface of the housing 210. The ends 232 may be electrically connected to a printed circuit board (not shown) or other substrate, for example, by surface mounting, by plated through hole (PTH) technology, by press-fit, or by other suitable techniques. For example, if surface mounting were used, the ends 232 may be soldered to electrically-conductive pads on the surface of the substrate. As arrays become smaller, routing challenges escalate accordingly, especially in high speed, high pin-count devices. Electrical attributes are often the first to suffer. In high-density applications, particularly those involving pitches of 0.5 to 0.8 or less, the ends 232 may be surface mounted to pads at various levels within a multi-layer substrate, such as a printed circuit board, as described, for example, in U.S. Pat. Nos. 5,543,586 and 5,659,953, to maintain a pluggable format.

The die package 100 mates with the mating socket 200 to form electrical paths between the at least one semiconductor die within the package housing 110 and the printed circuit board or substrate on which the mating socket 200 is mounted. Accordingly, electrical signals, power, and ground may be coupled to and from the at least one semiconductor die and the substrate.

In particular, the bottom surface of the package housing 110 is brought together with the upper surface of the mating housing 210 so that the posts 120 are received in the sockets 220. Consequently, as described in more detail below, the package pins 130 engage the socket contact beams 230 to form selectively attachable electrical connections. The package 100 is securely retained to the mating socket 200 by the force exerted between the socket contact beams 230 and the package pins 130 or by other suitable retention features. The die package 100 may be selectively detached from the mating socket 200 by pulling the die package 100 away from the mating socket 200, thereby slideably releasing the package pins 130 from the socket contact beams 230. Package 100 may be provided with, for example, 600–3000 package pins with arrayed pitches ranging from about 0.5 mm to 1.27 mm. A corresponding number of socket contact beams 230 may be provided at corresponding pitches. Of course, these are merely examples and more (or fewer) pins may be provided at greater or smaller pitches.

For example, embodiments of the package may be designed to fit the existing and future needs of high pin-count flip chip devices. Larger arrays, such as 1 mm and 0.8 mm, may utilize a spreader substrate to fan out signals from the 0.25 mm and 0.5 mm pitches to a scale more compatible with current cost-effective printed circuit board (PCB) technology. In many cases, 0.5 mm devices can be directly attached to the package structures. The packages may be designed to be near chip-scale in its smaller arrays. For example, 2500 inputs/outputs can be accommodated in a space approximately 32 mm×32 mm. The packages 100 and mating sockets 200 are designed to provide the mechanical stability and rigidity necessary for true socket operation that provides sufficient stability to handle the rigors of real-world handling.

Figure 3:
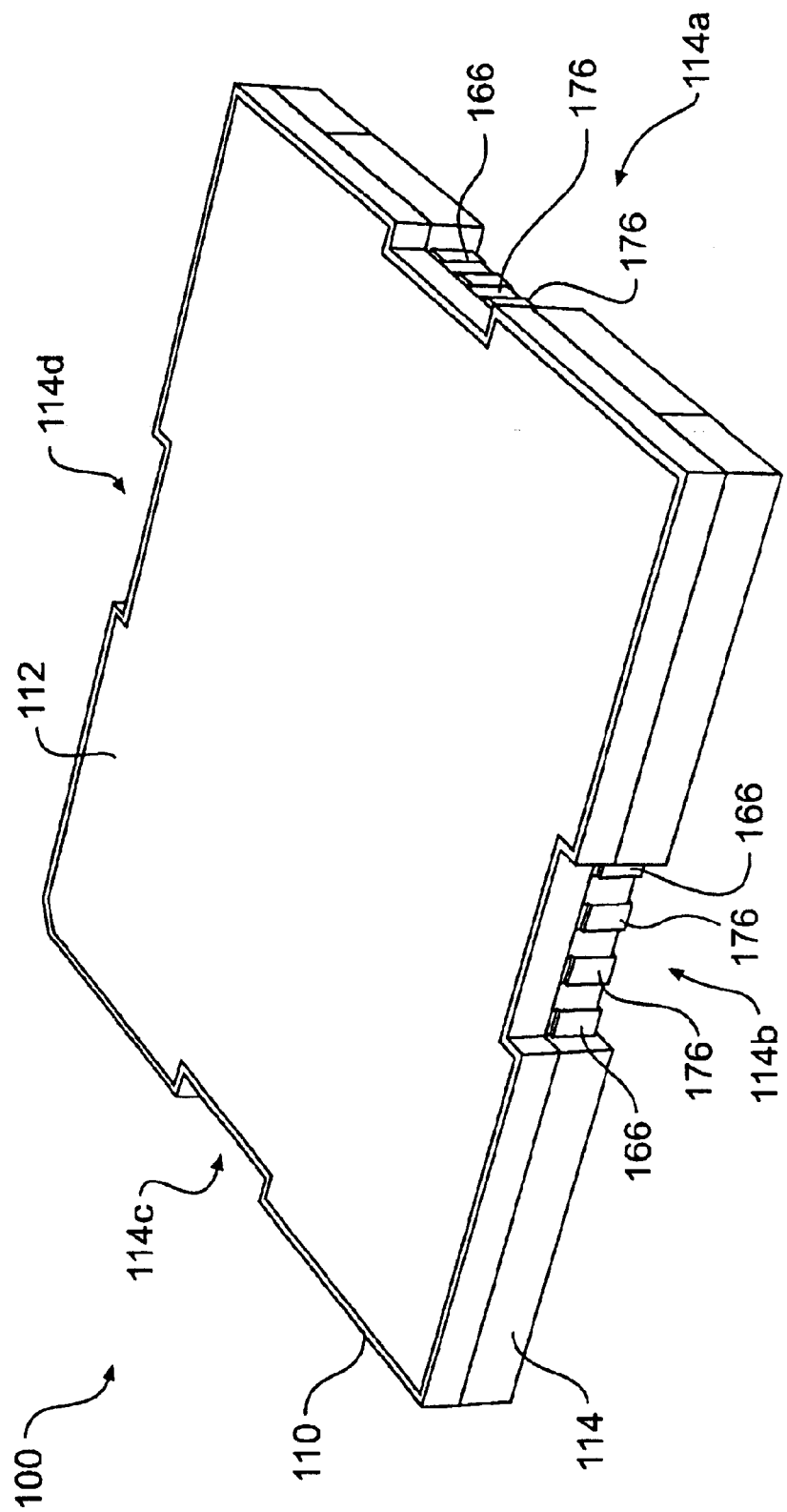
FIG. 3 provides a perspective view of an illustrative embodiment of a cluster grid array die package in accordance with the present invention.

FIG. 3 shows an illustrative embodiment of the package housing 110. As shown in FIG. 3, the package housing 110 may include an upper lid 112 and a lower housing base 114. The upper lid 112 may be formed, for example, of a thermally conductive material, such as copper. As such, the upper lid 112 permits heat to be dissipated from the package housing 110. This permits semiconductor dies within housing 110 to operate more efficiently. Alternatively or in addition, the die(s) may be encapsulated within the lower housing base using a suitable encapsulant. The base 114 may be formed of an electrically-insulative material. The material may be selected to approximate the thermal expansion properties of the base material of the semiconductor die, such as silicon, germanium, gallium arsenide, etc. One suitable material for base 114 is liquid crystal polymer, such as Vectra E130I, which may be purchased from Ticona of Summit, N.J. Liquid crystal polymer material is highly accurate in molding operations, maintaining tight tolerances yet offering high flow during the injection step of the molding process. Vectra, in its various formulations, has the potential to be doped to deliver the desired physical properties for an individual application, enhancing reliability and overall robustness. Of course, housing base 114 may be formed of another material or combination of materials as well.

As shown in FIG. 3, for example, the housing base 114 include indentations 114a–114d. As discussed further below, power contacts 166 and/or ground contacts 176 may be provided in one or more of indentations 114a–d. Of course, electrical paths for power and/or ground may be provided in other ways as well.

Figure 4:
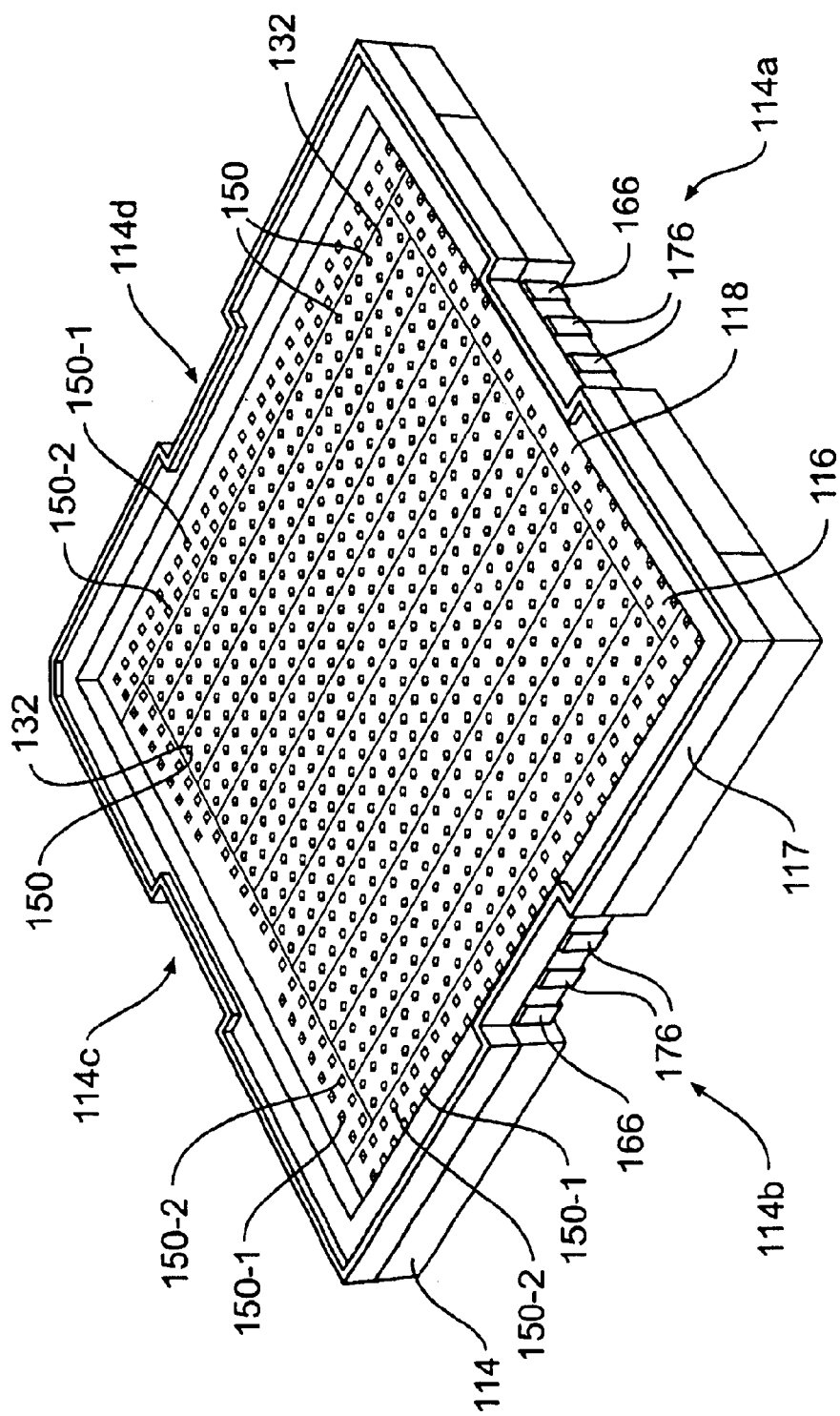
FIG. 4 provides a view of an illustrative embodiment of a housing base of the cluster grid array die package without substrate in accordance with the present invention.

FIG. 4 illustrates a top view of an exemplary embodiment of the housing base 114. As shown in FIG. 4, the housing base 114 includes a floor 116 and walls 117 that define a cavity 118 in which one or more semiconductor dies may be held. The cavity 118 may also hold a substrate, such as a multi-layer ceramic or polymer substrate, upon which one or more semiconductor dies may be mounted. Such a substrate may be, for example, a spreader substrate that serves as an adapter for converting the pitch of signals of the die to a pitch compatible with a printed circuit board or other substrate to which the die carrier is mounted. Solder balls 150 may extend from an upper surface of floor 116. The solder balls 150 may be formed on the ends 132 of package pins 130. Of course, while solder balls 150 are described herein as an example, the solder balls 150 may be replaced, in whole or in part, with other electrical connection elements, such as pads or bumps, conductive paste or other conductive material or combination of materials, or simply the ends 132 of the package pins 130 themselves. The solder balls 150 may be provided in an array, for example, as shown in FIG. 4. The solder balls 150 may be used to form an electrical contact to the at least one semiconductor die or the substrate upon which one or more semiconductor dies are mounted. If a substrate is provided, the substrate may provide an electrical path from the solder balls 150 to landings on the upper surface of the substrate. The semiconductor die(s) may couple directly to the landings or via other electrical material, such as bonding wires, tape automated bonds, jumpers, or other suitable electrical coupling. The solder balls may be applied directly to the semiconductor die, either before or after dicing the wafer, and then mounted to the die carrier.

In an exemplary embodiment, a set of solder balls 150 may be used for power supply and another set of solder balls 150 may be used for ground. The remaining solder balls may be available for signal transmission and/or other purposes. In an exemplary embodiment, an outer ring 150-1 or ring portion of solder balls 150 may be used for power supply. Another ring of solder balls 150-2 just inside of the outer ring may be used for ground. The rest of the solder balls 150 may be used as signal paths or other purposes. In the example shown in FIG. 4, 92 solder balls are used for power supply, 104 solder balls are used for ground, and 624 solder balls are available for signals or other purposes.

Figure 5:
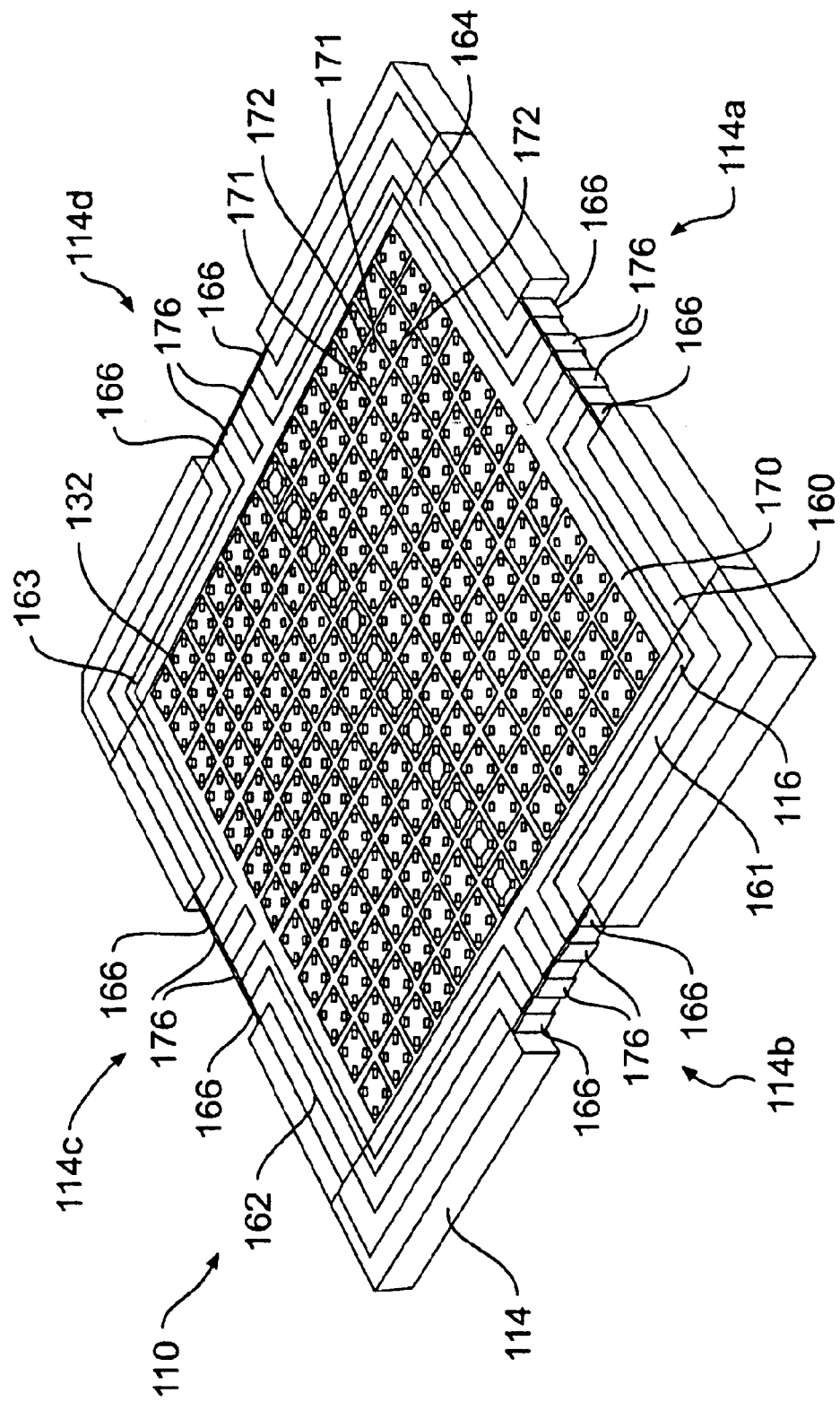
FIG. 5 provides a view of an illustrative embodiment of power and ground planes in the housing base in accordance with the present invention.

FIG. 5 illustrates a section view of an embodiment of housing 110 taken through base 114 to show power planes 160 and ground planes 170 within the floor 116. FIG. 5 shows ends 132 of package pins 130 extending through the floor 116 of the housing base 114. It should be noted that pairs of the package pins 130 may be used to provide power and ground connections. As noted above, solder balls 150 may be formed on the ends 132 of the pins 130. The particular arrangement of power planes 160 and ground planes 170 shown in FIG. 5 is merely exemplary. The power planes 160 and ground planes 170 may be formed as planar traces, as wirings, as frames, or another suitable shape.

The power plane 160 illustrated in FIG. 5 is provided in four trace segments 161, 162, 163, and 164. Segments 161, 162, 163, and 164 extends along the periphery of floor 116 between indentations 114a and 114b, indentations 114b and 114c, indentations 114c and 114d, and indentations 114d and 114a, respectively. As shown, the segments 161–164 may be generally L-shaped. However, the segments of power plane 160 may be provided in other shapes, for example, C-shaped, or another suitable shape, or may be placed above or below each other. The segments 161–164 may be supplied with different supply power voltages, for example, if the die package housed multiple dies that operate with multiple power supply voltages. The power plane 160 may be provided by any number of segments, from a single segment to five or more segments.

Ground planes 170 may be formed by trace segments arranged in rows 171 and trace segments arranged in columns 172 to form a checkerboard pattern. The rows 171 and columns 172 pass between the ends 132 of package pins 130. The rows 171 and columns 172 may be spaced so as to pass between groups of one or more pins 130. As shown in FIG. 5, for example, the rows 171 and columns 172 divide the pins 130 into groups of four. FIG. 5 further shows each of the rows 171 and columns 172 coupled together. However, this is not required. The rows 171 and columns 172 may form multiple ground segments, for example, to isolate certain signal paths from others. For example, the checkerboard pattern shown in FIG. 5 may be easily converted into two segments by cutting each row line 171 between two adjacent columns lines 172, into four quarter segments by further cutting each column line 172 between adjacent row lines 171, etc.

Power contacts 166 and ground contacts 176 may be provided at indentations 114a–114d. Electrical connection between the power and ground planes 160, 170 and the mating socket 200 may be provided at power and ground contacts 166, 176. The embodiment shown in FIG. 5 includes two power contacts 166 and two ground contacts 176 per indentation 114a–114d. However, this is merely illustrative. Any number (1 or 3 or more) power and ground contact may be provided. The embodiment of FIG. 5 shows four indentations 114a–114d, but it should be appreciated that 1, 2 (on either adjacent or opposite sides of housing 110), or more indentations 114 (e.g., multiple indentations on one or more sides of housing 110) may be provided. Moreover, the power and ground contacts 166, 176 need not be provided at indentations 114 at all. Power and ground contacts may be provided, for example, on the outer sides of housing base 114 or through the bottom surface of the housing base 114 (e.g., using package pins 130 or otherwise).

Figure 6:
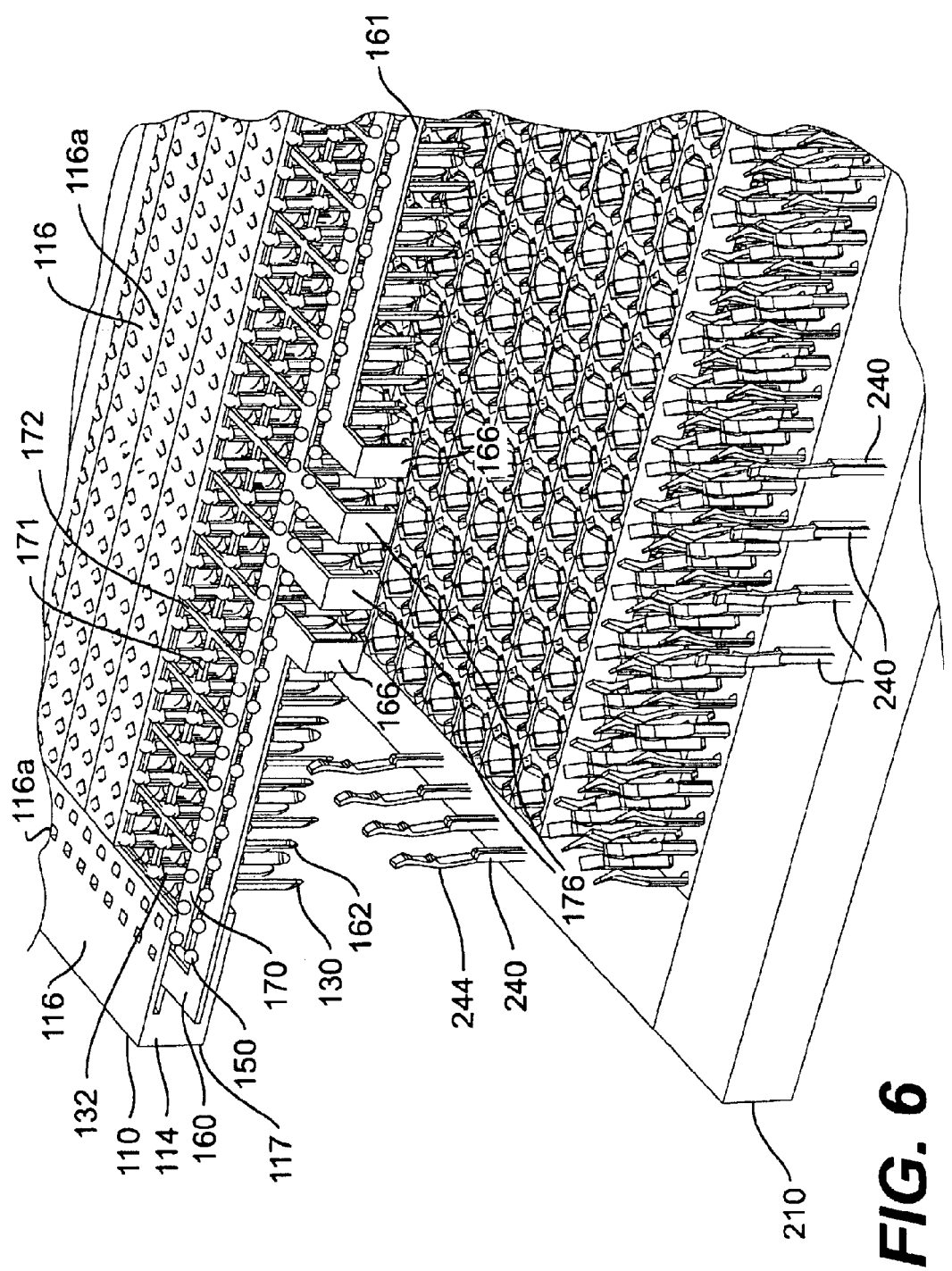
FIGS. 6 and 7 provide views of an illustrative embodiment of the power and ground planes in the housing base in accordance with the present invention.
Figure 7:
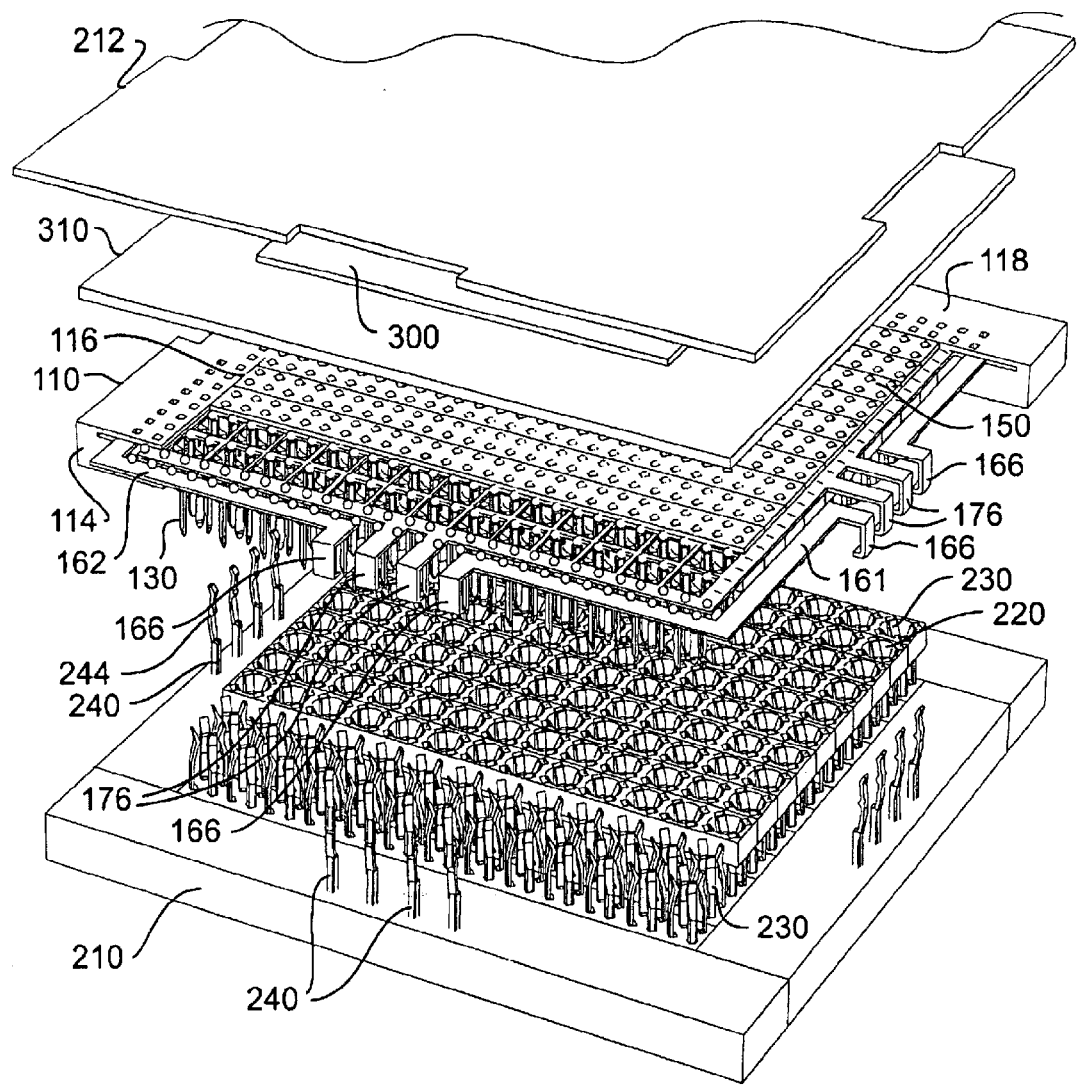

FIG. 6 provides a cutaway view of a section of base 114 to illustrate one exemplary embodiment for forming contacts 166 and 176. FIG. 7 illustrates the entirety of the embodiment shown in FIG. 6. As best seen in FIG. 6, the power plane segment 162 may extend along the base 114 at indentation 114b (not shown) to provide a power contact 166. Similarly, power plane segment 161 may form a power contact 166. Ground plane 170 may include one or more extensions, such as extensions shown in FIG. 6, that extend laterally along the outer side wall 117 at indentation 114b to form one or more ground contacts 176.

The power and ground contacts 166, 176 may contact power and ground mating pins 240 of mating socket 200 to form an electrical connection. The power and ground mating pins 240 may have a resiliently flexible contact beam 244 that flexes outwardly when in contact with the power and ground contacts 166, 176 to maintain a normal force for good electrical contact.

FIG. 6 further illustrates holes 116a in floor 116 in which solder balls 150 sit. The holes 116a may extend entirely through the housing base 114 to accommodate package pins 130. Holes 116a to the power plane 160 and ground plane 170 do not necessarily extend through housing base 114, but may terminate at the power and ground planes 160, 170. As shown in FIG. 4, such holes 116a enable the solder balls 150 to contact the power and ground planes 160, 170 to form an electrical connection.

FIG. 7 provides an exploded view of an illustrative embodiment of the die package 100 to show the electrical contacts. A semiconductor die 300 and a substrate 310 are received in the cavity 118 of the housing base 114. The semiconductor die 310 mounts to the substrate 310. The substrate 310 may be a multi-layer ceramic or polymer substrate that provides electrical connection between the solder balls 150 and the semiconductor die 300. Such a substrate 310 may be, for example, a spreader substrate that serves as an adapter for converting the pitch of signals of the die to a pitch compatible with a printed circuit board or other substrate to which the die carrier is mounted. The substrate 310 contacts the solder balls 150 exposed on the floor 116 of the base 114. Some of the solder balls 150 contact the package pins 130 and others contact the power and ground planes 160, 170. The lid 112 seals to the base 114 to retain the die 300. The die package 100 couples to the mating socket 200 such that package pins 130 engage socket contact beams 230 and such that power and ground contacts 166, 176 engage power and ground mating pins 240. Ends 232 of the socket contact beams 230 (not shown) and ends 242 of mating pins 240 (not shown) may couple to a substrate, such as a printed circuit board.

Because package electrical performance is a factor for GHz-bandwidth signal transmission and sub-nanosecond switching, interconnect impedance control through the package is important for suppressing reflections and attendant noise interactions at the higher end of the signal spectrum. Maintaining good impedance control in a structure as three-dimensional as a high-density package is a challenging undertaking, requiring careful consideration of how power and ground distribution is effected through the package. In other words, in addition to designing the power and ground distribution for reducing inductance during switching, attention must be paid to providing an effective return path for the current for all signal traces in the package. This purpose contributed to the introduction of power/ground planes in high-speed packages.

Figure 8:
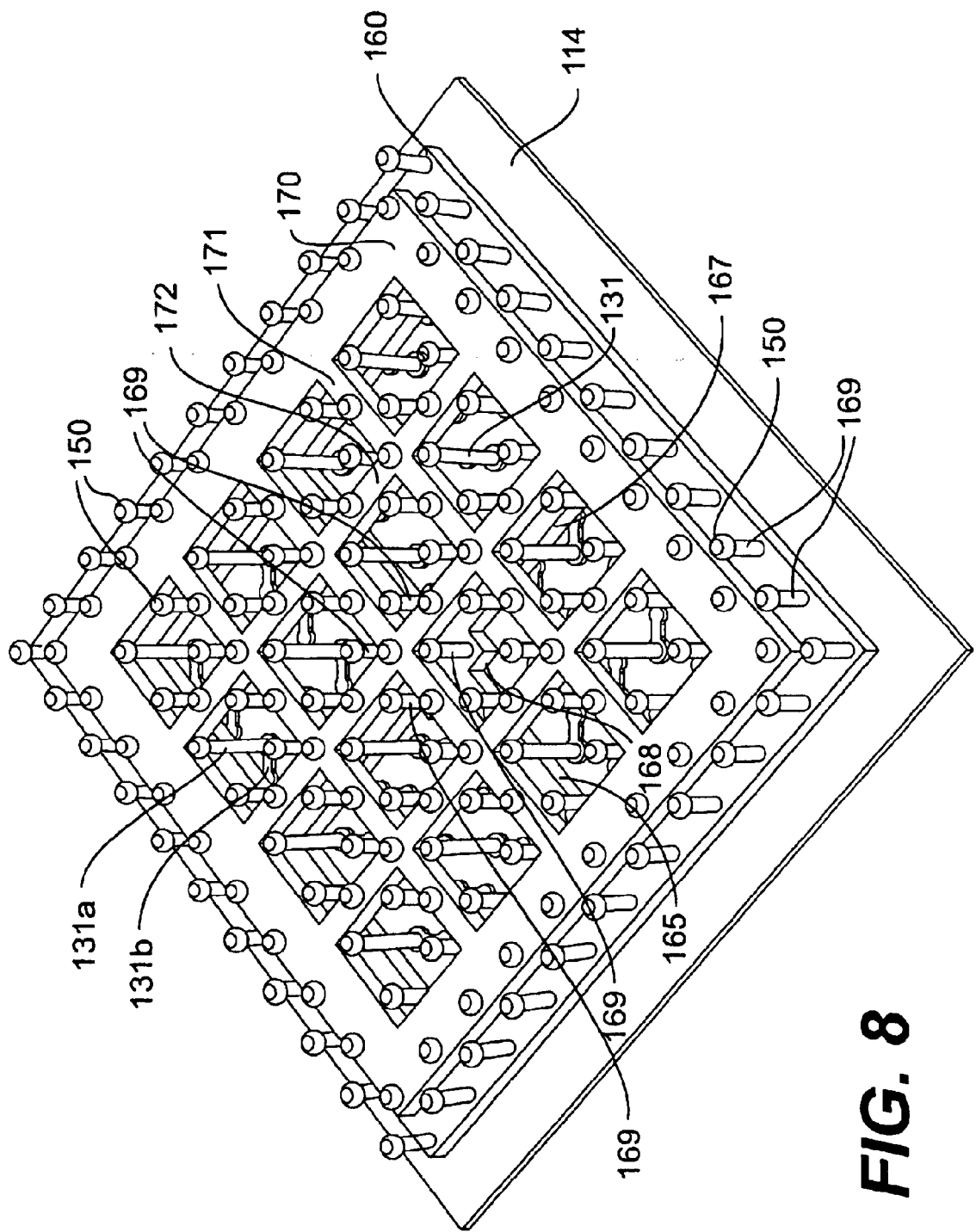
FIG. 8 provides a perspective view of a further illustrative embodiment of power and ground planes in the housing base in accordance with the present invention.
Figure 9:
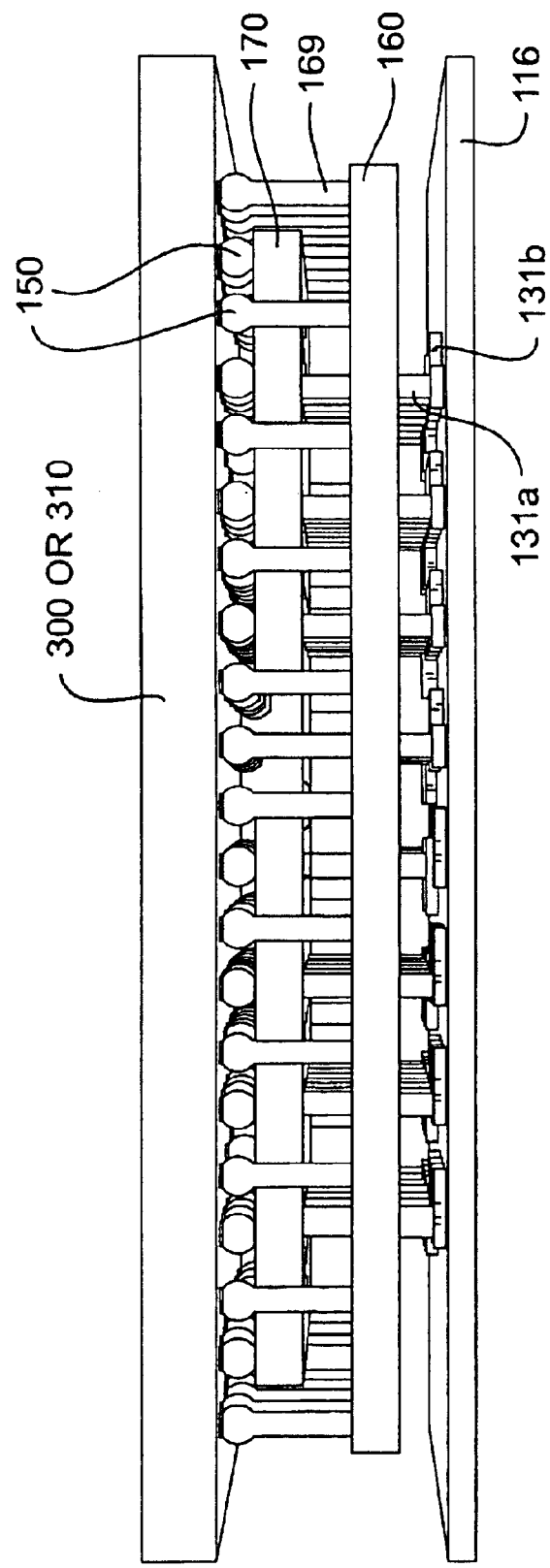
FIGS. 9 and 10 provide side and bottom views, respectively, of the further illustrative embodiment of the power and ground planes in the housing base in accordance with the present invention.
Figure 10:
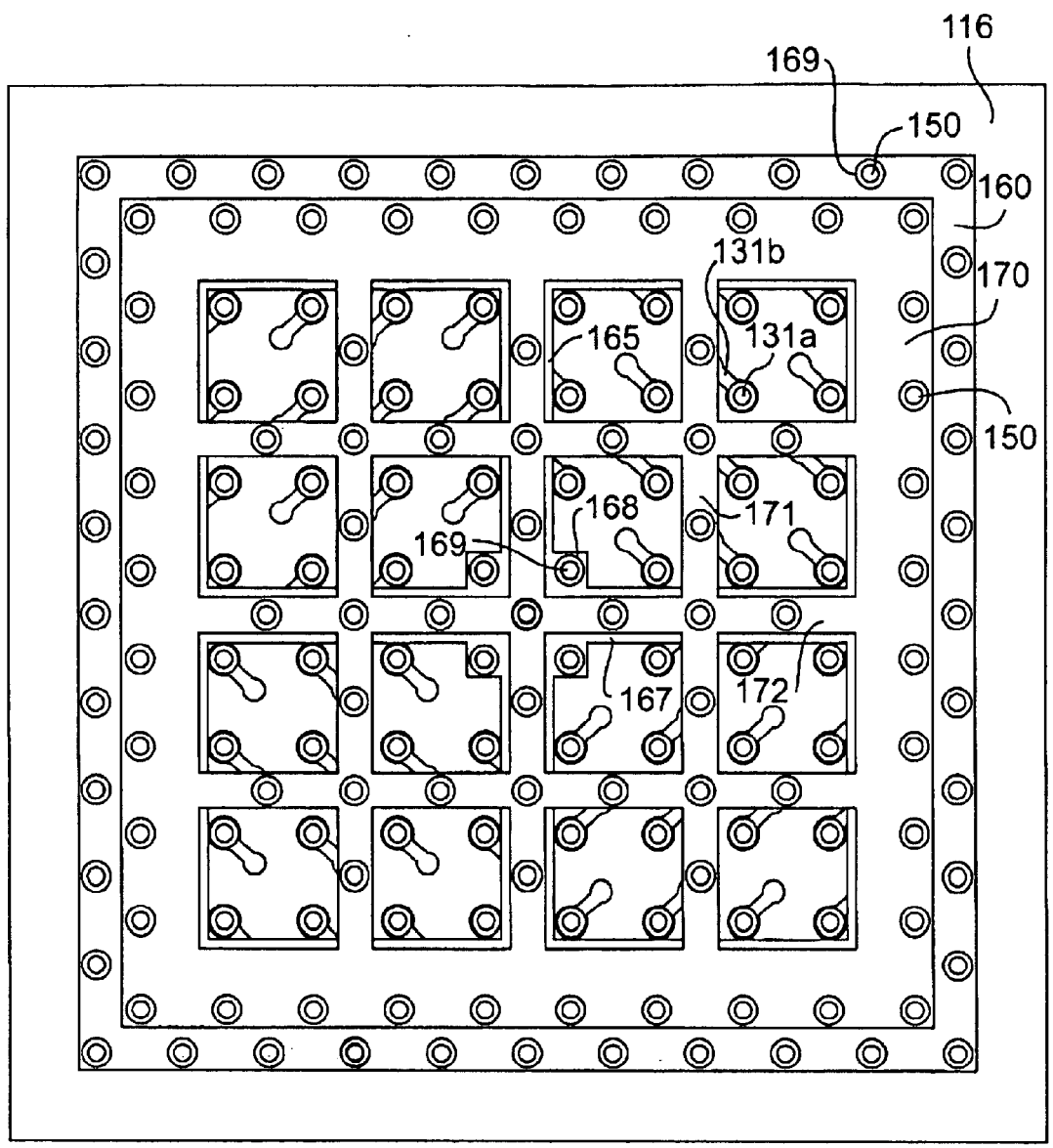

FIGS. 8–10 illustrate an example of an alternative power and ground mesh combination used on the chip side in the package housing. As in FIGS. 5–7, the power/ground planes may be positioned directly under the die or die/substrate combination to assist in power distribution and signal termination. As shown in FIGS. 8–10, ground plane 170 may be provided at a first level within the floor 116 of package 100 and the power plane 160 may be provided at a second level within the floor 116. For example, the power and/or ground planes may be insert molded into the floor of package 100 or attached with an adhesive after the floor, or a portion of the floor, is molded. In the latter case, the power and ground planes 160, 170 may be combined into a separate unit. As shown in FIGS. 8–10, the ground plane 170 is provided between the power plane 160 and the intended location of the die 300. Of course, as an alternative, the location of the power plane 160 and the ground plane 170 may be reversed. A coating may be applied to one or both of the power and ground planes 160, 170 to electrically insulate them from each other and other components. The coating(s) may be extremely thin to reduce inductance, e.g., of the package. The ground plane 170 may have a grid design of interconnecting rows 171 and columns 172. As above, a plurality of solder balls 150 may be used to couple the ground plane 170 to the semiconductor die 300 or to the substrate 310, for example.

The power plane 160 may also have a grid design of intersecting rows 165 and columns 167. The power plane 160 is designed to have a greater overall length and/or width than the ground plane 170 to improve electrical performance and to simplify electrical connection to solder balls. Of course, other arrangements are possible. In the embodiment shown in FIGS. 8–10, the power plane 160 includes a central row 165 and a central column 167 that intersect at a center plane 168. Of course, additional rows 165 and columns 167 may be provided if desired.

Power plane 160 is coupled to solder balls 150 by plugs or extensions 169 that extend through a hole 116a (not shown) in base 114. In the example illustrated in FIGS. 8–10, extensions 169 are provided spaced apart at the periphery of power plane 160. This arrangement provides additional space for pins 130 and/or signal pin extensions 131, which may be used to connect the signal pins to the solder balls 150, to the die, or to the substrate. Signal pin plugs or extensions 131 may be formed by two parts: a vertical extension 131a and a horizontal extension 131b. Vertical extensions 131a provide a vertical path toward the die 300. Horizontal extensions 131b may be used to fan out the signal paths between the die 300 and the package pins 130. Extensions 169 are also provided at the center plane 168 to permit connection to solder balls. FIGS. 8 and 10 illustrate four extensions 169 providing electrical connection from the center plane 168 to the solder balls 150. Of course, additional extensions 169 may be provided between the power plane 160 and the solder balls 150. Alternatively, extensions 169 may provide electrical contact to the die 300 or to the substrate 310 on which the die is mounted.

It should be pointed out that for the sake of clarity, the metallization density in the planes 160, 170 shown in FIG. 8–10 does not reflect the actual metallization density. For example, in the case of a 0.8 mm-pitch package design with 624 signal pins, the number of "cells" in the ground mesh 170 may be 156 and the number of corresponding power cells in the power mesh 160 may be 36. In the mesh structure, the area array contact with the die is facilitated for both power and ground with the chip. Furthermore, the arrangement is such that the "effective" value of the power and ground inductance introduced by the package remains low. Even though the quantification of an "effective" value of the power inductance during switching is difficult, an approximate calculation of such a quantity is possible by considering in a qualitative manner those factors that have an impact on its value. For an example having a 0.8 mm pitch, the calculated value of the self-partial-inductance of the ground mesh is 0.32 nH. Additionally, the mutual partial-inductance between the power and ground mesh in the case of a 0.3 mm separation between them is found to be 0.2 nH. Thus, the effective value of ground inductance introduced by the ground mesh during switching is 0.12 nH in this example.

A similar calculation can be performed to estimate the worst-case effective inductance introduced by the power mesh 160. Assuming the example provided above and that the power mesh metallization is the same as that of the ground mesh, the worst-case effective inductance introduced by the power mesh is found to be 0.23 nH. This value is higher than that of the ground mesh because of the coarser mesh metallization used for the power mesh. Remarkably, this value can be reduced even further by increasing the width and thickness of the metallization. In any case, it is stressed once more that these are worst-case values for specific examples, and that the power-ground mesh configuration is designed in such a manner that the "effective value" of power and ground inductance can be controlled through the assignment of some of the pins in the clusters as extra power and ground pins.

The presence of the ground plane in the package housing immediately beneath the die likewise allows for impedance control for those signal traces that need to be fanned out away from the die. The mesh structure can be added in one or more places, depending upon the electrical needs. For example, in the case of a 0.8 mm-pitch package design, signal trace impedance values in the range of 50 to 70 Ohm are easily attainable through selection of signal trace width and separation from the ground mesh. The same holds true for signal traces routed between the power and ground mesh planes, as well as below the power mesh plane. The number of signal layers that may be used is dependent on input/output pin count and density, as well as crosstalk constraints.

Figure 11:
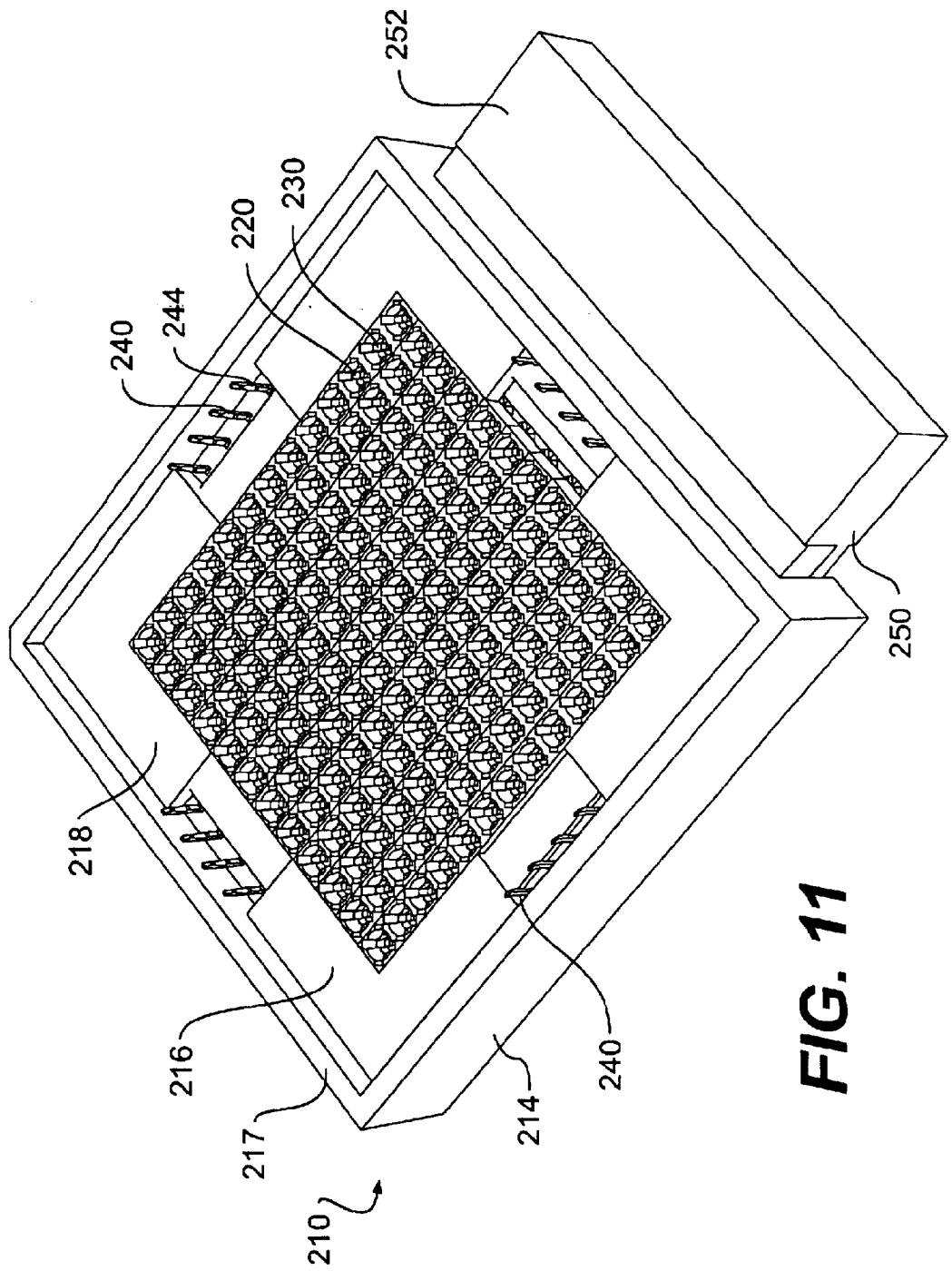
FIG. 11 provides a view of an illustrative embodiment of a mating socket in accordance with the present invention.

FIG. 11 illustrates an exemplary embodiment of a mating socket 200. As shown, mating socket 200 includes a housing 210 having a floor 216 and side walls 217 that define a cavity 218 sized to receive the die package 100. The floor 216 includes a plurality of sockets 220. Sockets 220 are sized and positioned to receive the posts 120 of the die package 100. Sockets 220 may be arranged in an array pattern. Socket contact beams 230 are positioned within the sockets 220. In the example shown in FIG. 11, four socket contact beams 230 are provided for each socket 220. However, any number of socket contact beams 230 may be provided per socket, such as 2, 3, or 5 or more. The socket contact beams 230 extend through and are held in the housing 210. For example, the housing 210 may include holes formed therethrough into which socket contact beams 230 are inserted and held via friction, adhesives, and/or mechanical expedients, such as spurs, wedge, or tongue-and-groove arrangements. Power and ground mating pins 240 may be similarly held in the housing 210. The embodiment of FIG. 11 includes a cam mechanism 250 with a cam lever 252. The cam mechanism 250 may be used, as described in more detail below, to reduce the insertion force needed to plug the die package 100 into the mating socket 200.

Figure 12:
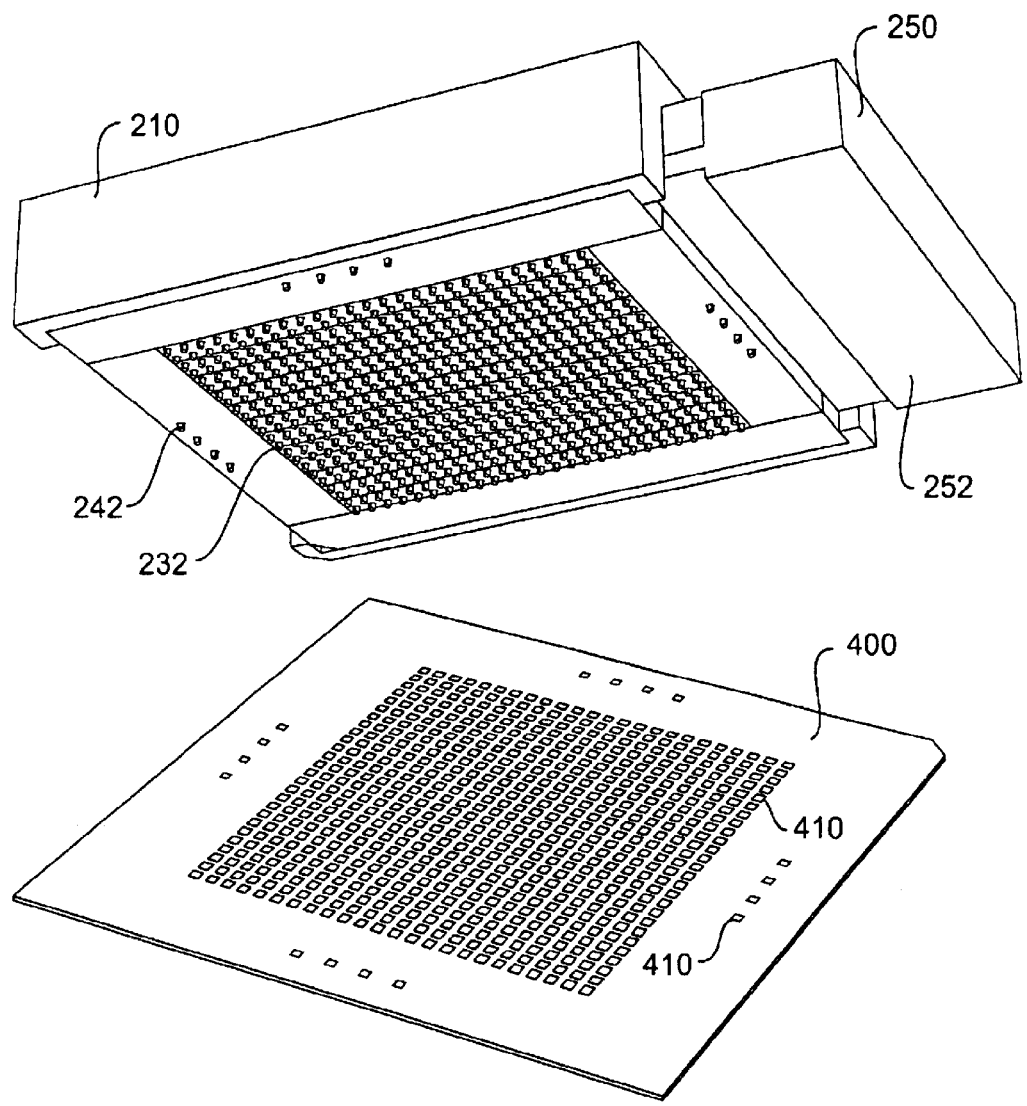
FIG. 12 provides a view of an illustrative bottom view of the mating socket and printed circuit board pad or substrate layout to which the mating socket may be attached in accordance with the present invention.

FIG. 12 illustrates a bottom surface of mating socket 200 and a portion of a substrate, in this case a printed circuit board 400, to which it may be attached. Ends 232 of socket contact beams 230 and ends 242 of mating pins 240 extend from a bottom surface of housing 210. The ends 232, 242 may contact pads 410 formed on circuit board 400 to form an electrical connection. In particular, the ends 232, 242 may be soldered to the pads 410 to retain the mating socket 200 to the circuit board 400 and at the same time form an electrical connection. As shown, the pads 410 are arranged in the same pattern as the ends 232, 242. Traces (not shown) may lead to contact pads 410 to couple electrical signals to and from the contact pads. Alternatively, the pads 410 may be replaced by plated through holes through which the ends 232, 242 may extend. Solder may be used to electrically connect and retain ends 232, 242 in such through holes. Of course, the description herein is merely exemplary and other techniques may be used to couple the mating socket 200 to a substrate.

Figure 13:
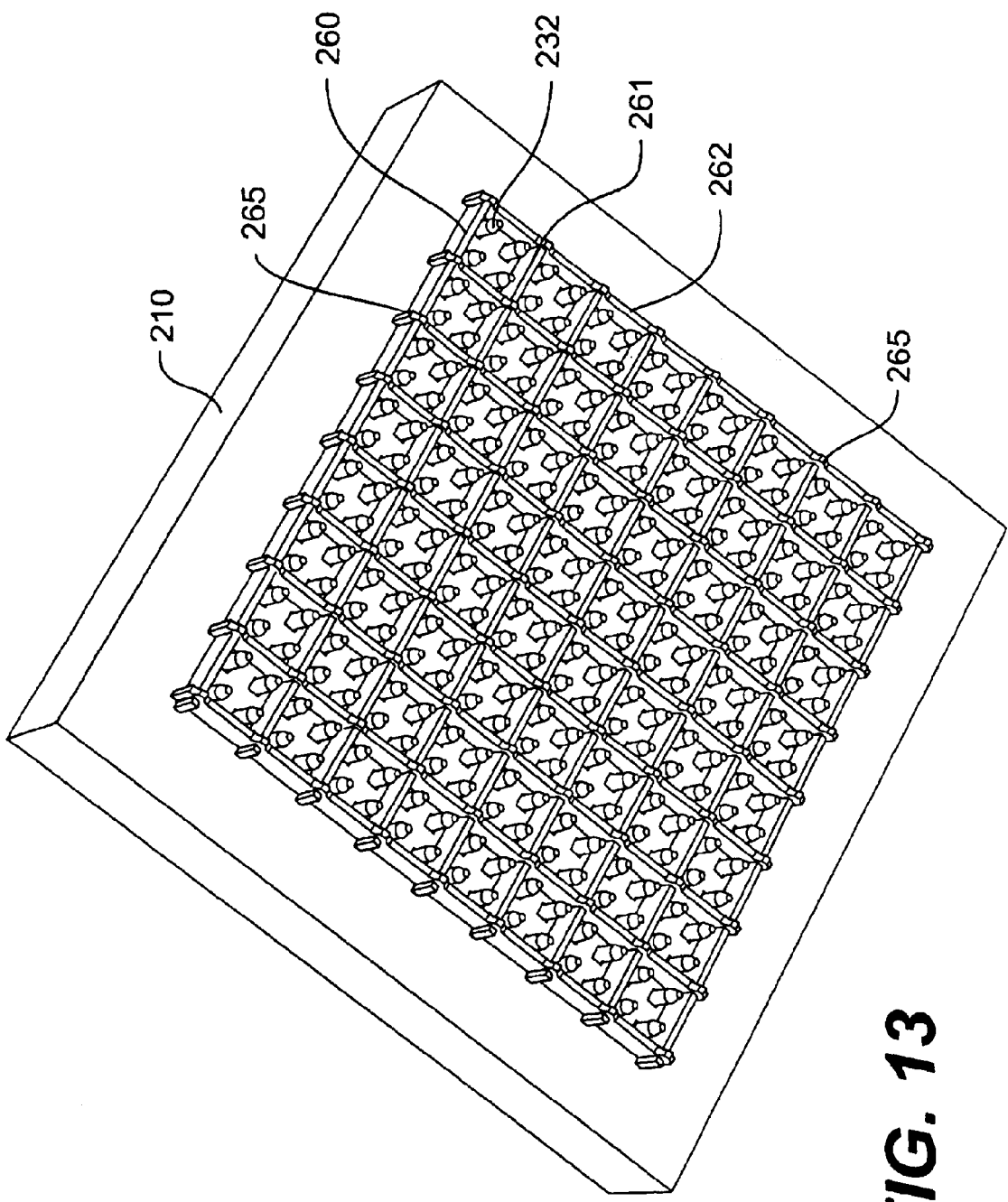
FIG. 13 provides a further illustrative bottom view of the mating socket in accordance with the present invention.
Figure 14:
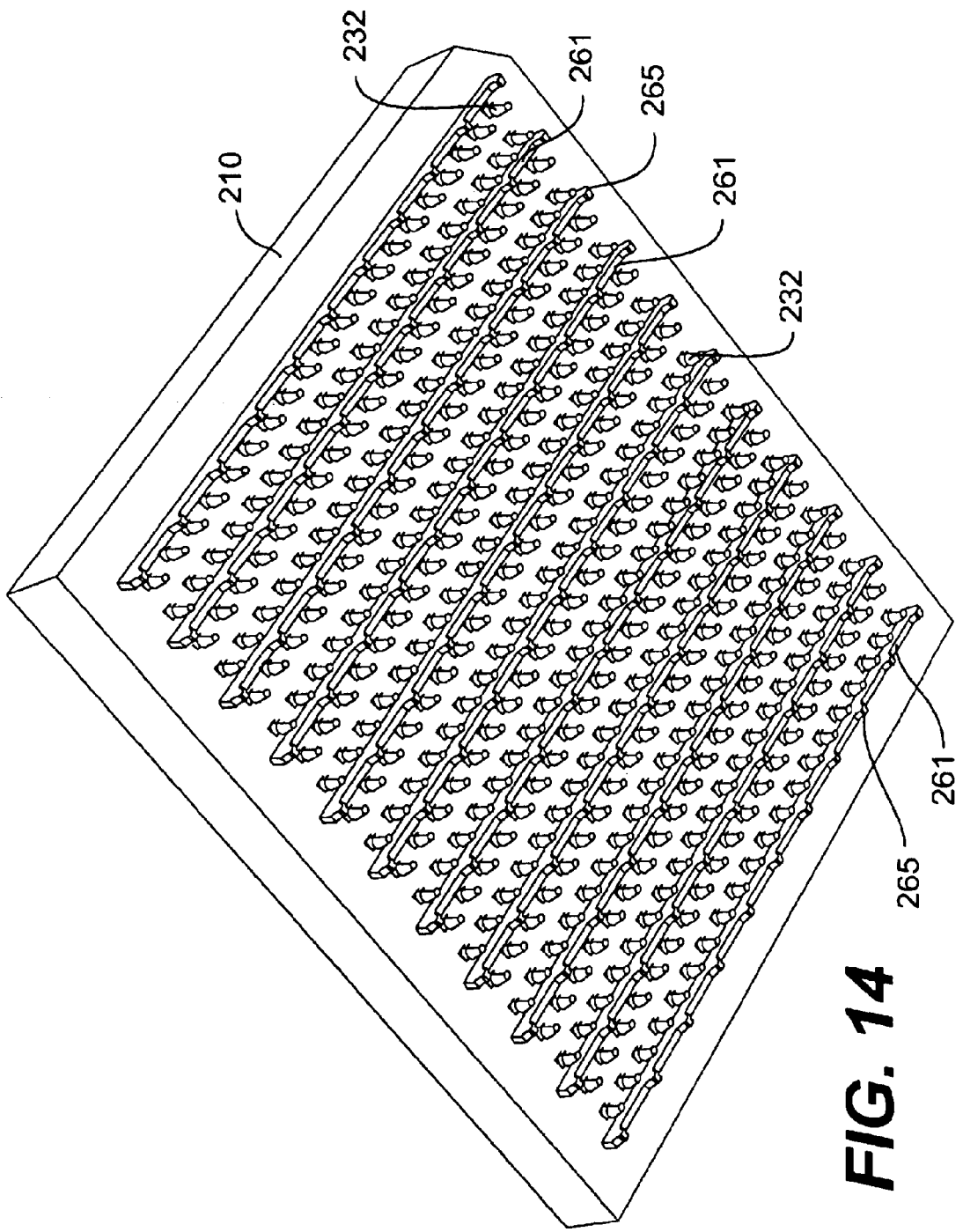
FIG. 14 provides a further illustrative bottom view of the mating socket in accordance with the present invention.

FIGS. 13 and 14 illustrate two alternative arrangements of the bottom surface of mating socket 200. For simplicity, FIGS. 13 and 14 illustrate only the ends 232 of socket contact beams 230. FIGS. 13 and 14 each illustrate designs incorporating a ground mesh 260. In particular, FIG. 13 shows the bottom surface of mating socket 200 with an isolation gate structure providing a ground for signal beams 230. A reduced number of beams 232 is shown for the sake of clarity. More particularly, the ground mesh 260 includes electrically-conductive rows 261 and columns 262 that intersect to divide the ends 232 of beams 230 into groups or cells. While FIG. 13 illustrates a ground mesh 260 that divides the ends 232 of beams 230 into cells of four, the mesh 260 may be designed to divide the ends into groups of one, two or three, or five or more. The rows and columns 261 and 262 include bumps 265 for making electrical contact with the substrate, e.g., printed circuit board, on which the mating socket 200 is mounted. Bumps 265 are spaced periodically on the surface of the ground mesh 260. Of course, bumps 265 may be omitted or replaced by other contact structure.

An alternative grounding structure, as shown in FIG. 14, features isolation rows 261, allowing for somewhat lower manufacturing costs as well as improved airflow beneath the socket 200. As shown in FIG. 14, the rows 261 are provided between every other row of ends 232 of beams 230. As above, rows 216 may be provided between every row of ends 232 or between a larger number of rows. In FIGS. 13 and 14, the meshes 260 are regularly spaced, but of course irregular mesh spacing may be used if desired.

As mentioned earlier, in addition to the use of the power mesh and the peripheral ground pins, the beams 230 in the cluster or group may also be used for a more direct power distribution to different locations on the die 300. The presence of the ground structure 260 facilitates the reduction of the effective power inductance that the beams 230 present during switching. As a measure of this inductance value, let us consider the case in which four beams 230 in one cluster are used as power pins. In a 0.8 mm-pitch design, where the stacking height is 7.6 mm, and a socket ground structure as detailed in FIG. 14, the "effective" power inductance during switching is calculated to be 0.23 nH. This value can be further reduced through the assignment of more of the beams as power elements.

Figure 15:
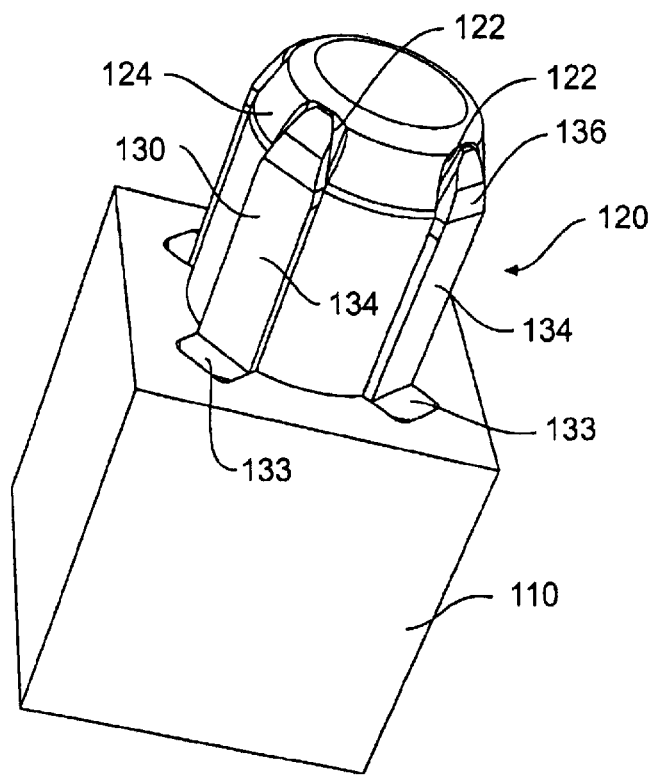
FIG. 15 shows an illustrative embodiment of a single buttress and cluster of package pins in accordance with the present invention.

FIG. 15 illustrates an example of a post 120 and package pins 130 that may be used in connection with the present invention. Post 120 extends from a lower surface of housing base 114. In one preferred embodiment, the posts 120 are formed simultaneously with the housing base 114 using a molding process. The post 120 may include axially-extending grooves 122 spaces around the circumference of the post 120. The grooves 122 are adapter to receive at least a portion of package pins 130. The post 120 may have a generally circular cross section with cut-outs for grooves 122. However, other cross-sectional shapes are possible as well, such as squares, rectangles, pentagons, hexagons, etc., with or without grooves 122. Post 120 further includes an angled tip 124. The tip 124 aids insertion of the post 120 into a socket 220 of the mating socket 200. The tip 124 may, for example, help to properly spread socket contact beams 230 in the event of minor misalignment.

Package pins 130 include an end portion 132 (not shown in FIG. 15), a stabilizer portion 133 extending within the housing, contact portion 134 extending outside of housing 110. The stabilizer portion 133 functions to hold the pin 130 stable in the housing and may thicker than the contact portion 134. The contact portion 134 is adapted to form an electrical connection with socket contact beams 230. The contact portion 134 may extend in groove 122. The contact portion 134 may include a rounded tip 136. The rounded tip 136 helps to flex socket pin 130 outwardly during mating. In the example of FIG. 10, four package pins 130 are provided per post 120. However, another ratio of pins 130 per post 120 may be used, such as 2, 3, or 5 or more.

Figure 16:
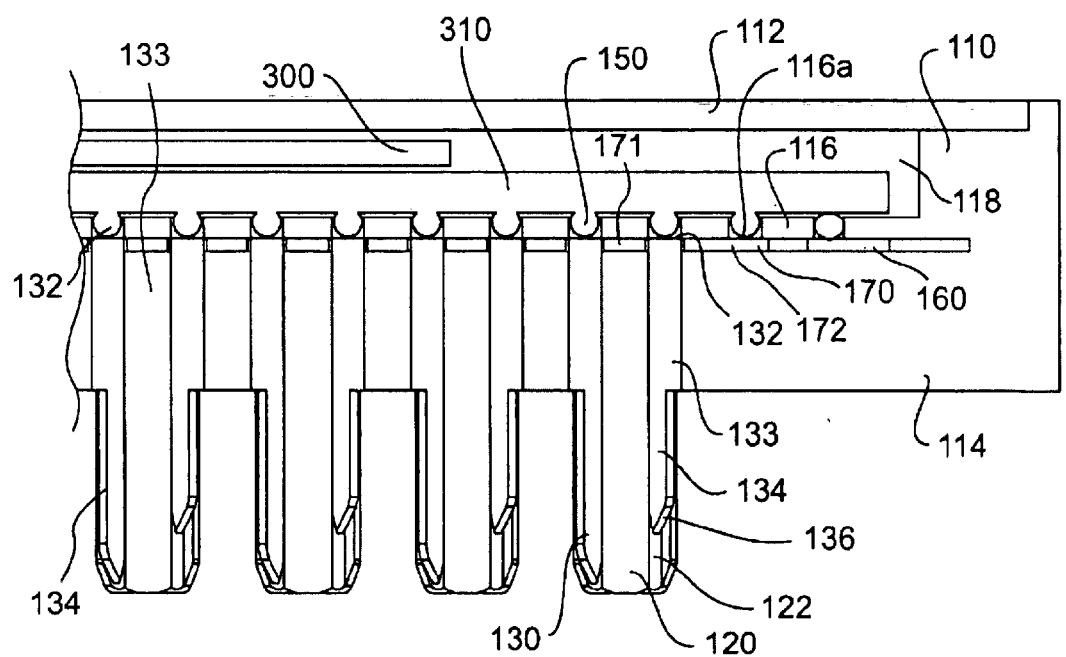
FIG. 16 shows a cross section of an illustrative embodiment of the die package of FIG. 7.

FIG. 16 illustrates an exemplary cross section of die package 100 through posts 120. Posts 120 extend from the bottom surface of housing base 114. Package pins 130 extend through the housing base 114 and along the posts 120 such that a contact portion 134 is exposed externally of the package housing 110. The stabilizer portion 133 of each package pin 130 is held within the housing base 114, for example, by friction, an adhesive, spurs, and/or other suitable expedients. The portion 133 may be thicker than the contact portion 134 to provide added stability. Ends 132 of package pins 130 contact solder balls 150, which contact substrate 310 through holes 116a in floor 116. Holes 116a also permit solder balls 150 form contacts between power plane 160 and substrate 310 and between ground plane 170 and substrate 310. As shown in FIG. 16, the rows 171 and columns 172 of ground plane 170 extend between the package pins 130. Substrate 310 may have multiple levels and vias that form electrical connections between its bottom surface, which contacts the solder balls 150 and its upper surface adjacent die 300. Substrate 310 may make direct electrical connections with die 300. Alternatively or in addition, substrate 310 may have bonding pads which electrically couple to the die 300 via electrically conductive material, such as wire bonds, tape automated bonding, jumpers, etc. Thermal lid 112 caps the housing base 114 to retain and protect die 300.

As noted above, the base 114 may be formed by molding from a polymer, such as a liquid crystal polymer. Holes 116a may be formed during the molding process or by removing material after molding. The electrically-conductive power and ground planes 160, 170 may be a frame, such as a lead frame, that is molded into the base 114 when the base 114 is formed or may be applied to a surface of the base 114 after the base is molded. In such a case, an additional floor piece 116 having holes 116a may be formed over the power and ground planes 160, 170. Package pins 130 may be cut from wire stock and machined to the shape shown in the Figures, for example. The package pins 130 may be inserted into the holes 116a from the direction of the cavity 118. If a two-piece base and floor is used, the pins 130 may be inserted before the floor 116 is applied. In such a case, it is important that the ends 132 of pins 130 register with holes 116a. Solder balls 150 are laid over the holes 116a to contact the ends 132 of pins 130, the power plane 160, and the ground plane 170. The substrate 310 (if used) and die(s) 300 are then laid over the solder balls 150. Solder balls 150 may be melted to form an electrical and mechanical attachment and any other electrical connection within the cavity 118 may be made (e.g., wire bonding, etc.). The lid 112 may then be sealed to the base 114 to complete the package 100.

As shown in FIG. 16, the lengths of the contact portions 134 of package pins 130 may vary. For example, the length of the contact portion 134 of pin 130-1 is greater than the length of the contact portion 134 of pin 130-2. As a result, the contact portions 134 of pins 130-1 and 130-2 engage the corresponding contact beams 234 of the mating socket at different times during mating. In this way, the insertion force needed to couple the package 100 with the mating socket 200 may be reduced.

Figure 17:
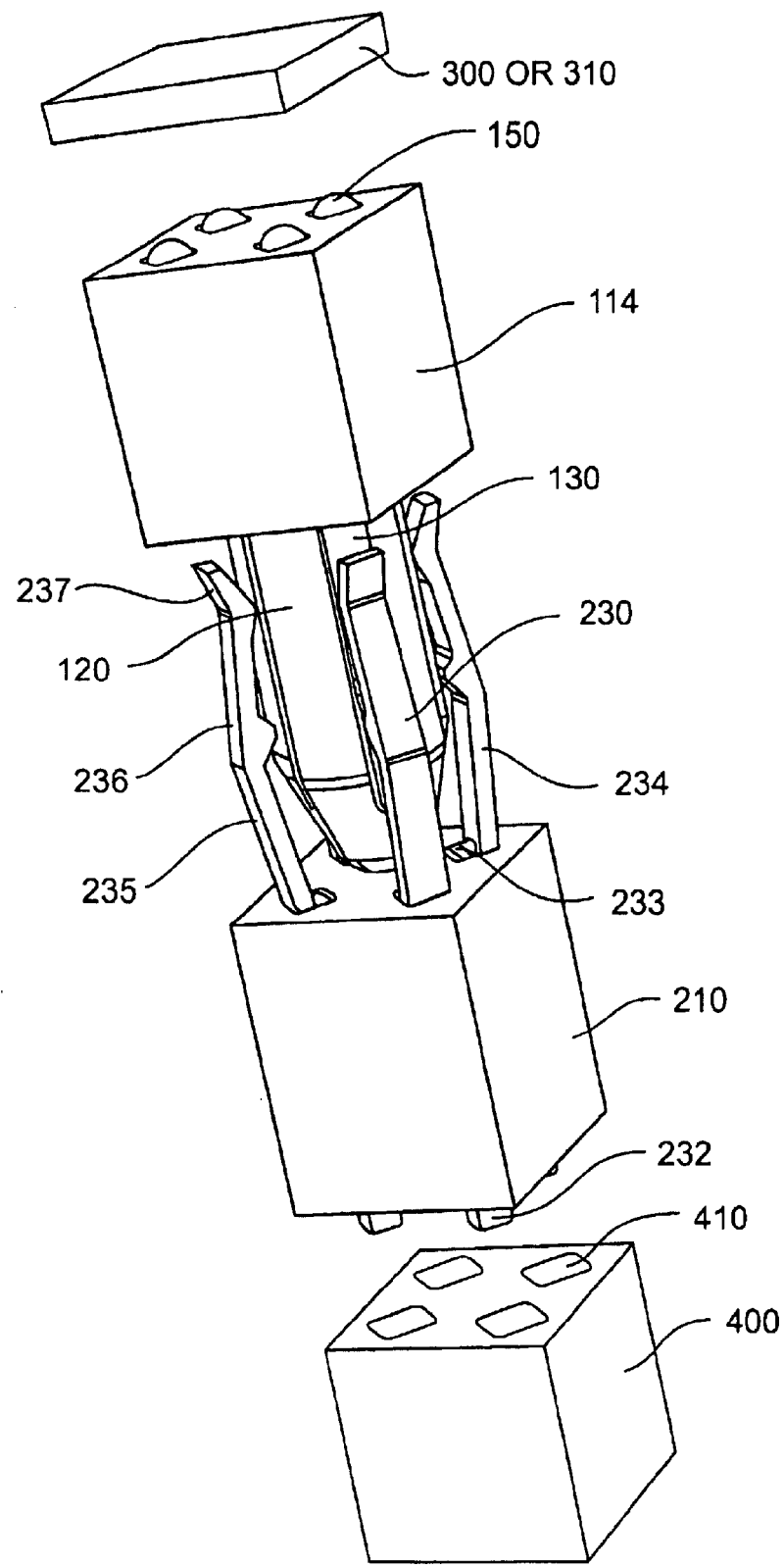
FIGS. 17 and 18 show an illustrative electrical path between a die or substrate and a circuit board through a cluster grid array die package and mating socket.
Figure 18:
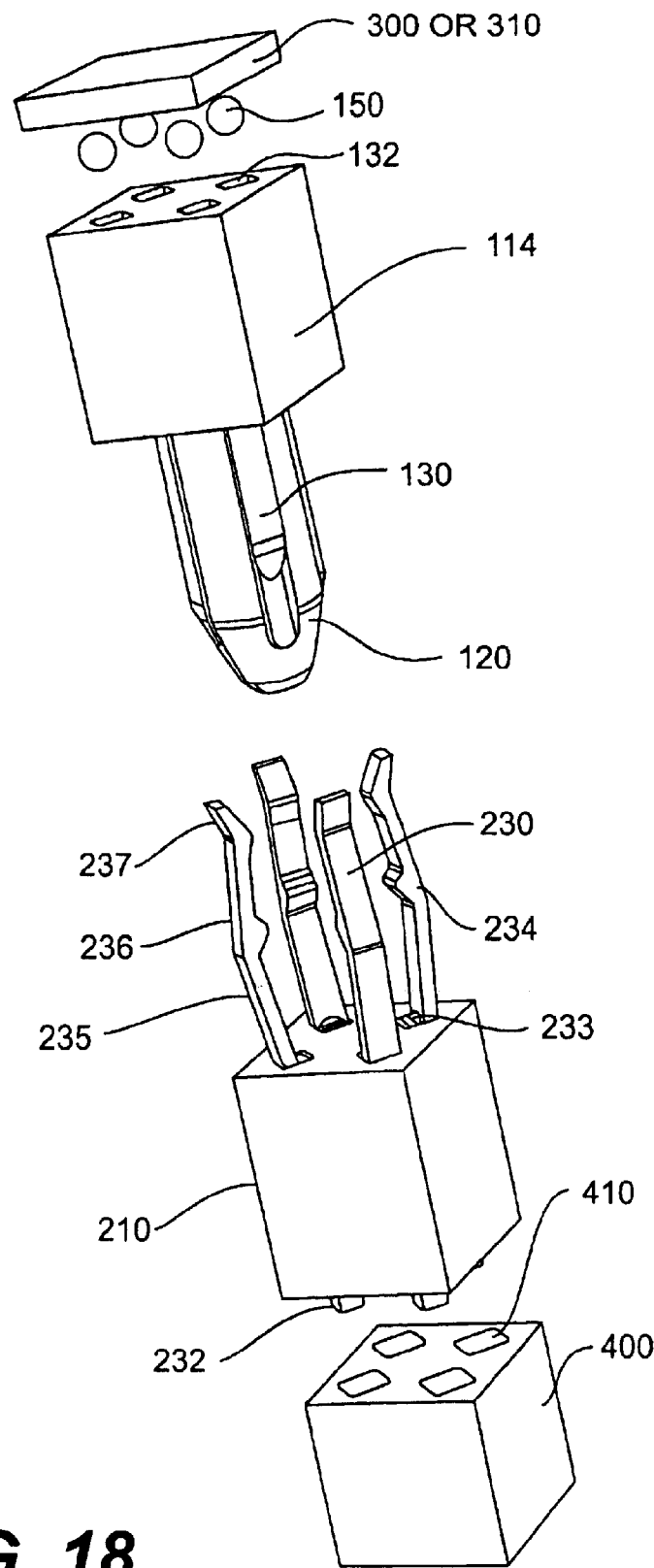

FIGS. 17 and 18 illustrate an exploded view of an exemplary electrical connection path between die 300 (or substrate 310) and a substrate 400, such as a printed circuit board, for a single cluster of package pins 130 and socket contact beams 230. The signal paths through the package 100 and the socket 200 are realized through the four-pin cluster shown in FIGS. 17 and 18. Die 300 couples to solder balls 150, which are in electrical contact with the ends 132 of package pins 130. As noted above, extensions or plugs 131 may be provided to couple the ends 132 of pins 130 to the solder balls 150 or directly to the die 300 or substrate 310. Contact portions 134 of package pins 130 extend along the post 120 and are spaced apart around the circumference of the post 120. The post 120 and package pins 130 are received in a socket 220 (not shown for ease of understanding) and engage socket contact beams 230.

The socket contact beams 230 include resilient, flexible contact beams 234 that extend from the housing 210. Contact beams 234 each include an upstanding portion 235, a first angled portion 236, and a second angled portion 237. The first angled portion 236 angles inwardly, toward the space for receiving post 120. The second angled portion 237 angles outwardly away from the space for receiving post 120. Accordingly, as the post 120 is received, the second angled portion 237 helps to spread the contact beam 234 outward away from the post 120. The first angled portion 236 helps to provide a normal force against the contact portion 134 of the package pins 130 for a good electrical connection. The socket contact beams 230 further include a stabilizer portion 233 held within the housing 210, for example, by friction, adhesive, spurs, tongue-and-groove, wedge, and/or other expedients. The stabilizer portion 233 may be thicker than ends 232 and beam 234 to maintain stability of the pin 230. Ends 232 of socket contact beams 230 extend from a bottom surface of housing 210 and may be surface mounted, for example, to bonding pads 410 on substrate 400. Accordingly, as provided in this example, an electrical path is formed from the die 300, to the solder balls 150, to the package pins 130, to the socket contact beams, and to the substrate 400.

The socket housing 210 may be formed by molding, for example. Similar to the package housing, the socket housing 210 may be molded from a polymer material and, after molding, the socket contact beams 230 may be inserted. Alternatively, the socket housing 210 may be molded around the contact beams 230. In addition, a ground or shield structure may be added to the socket housing 210. For example, the ground or shield may be molded into the socket housing 210.

Figure 19:
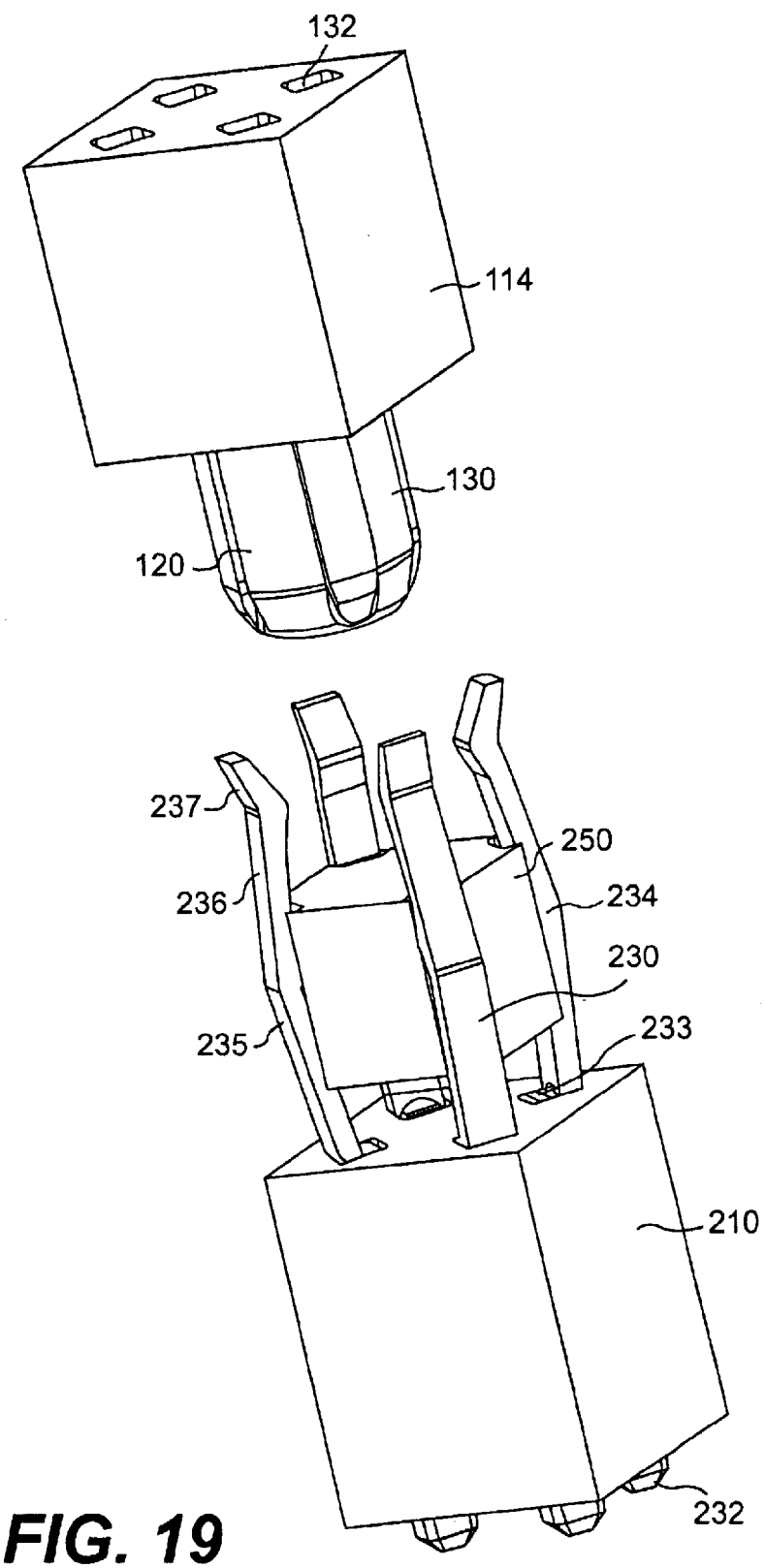
FIGS. 19 and 20 show the mating of pin clusters of a cluster grid array die package and a mating socket according to an illustrative embodiment of the present invention.
Figure 20:
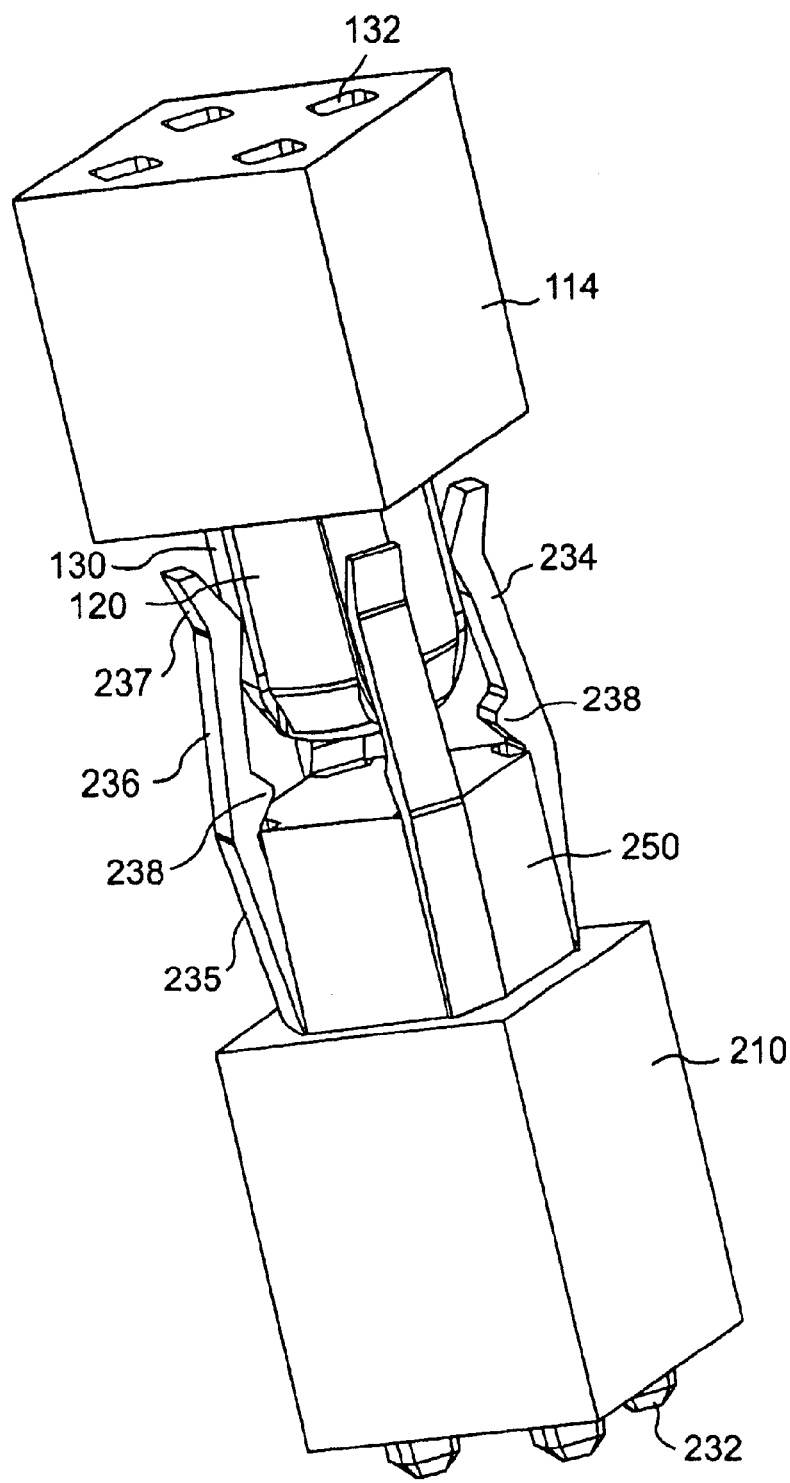

FIGS. 19 and 20 illustrate an embodiment in which insertion of the posts 120 into the socket 220 is aided by cam 250. As noted above, the contact beams are designed to have an adequate normal force to maintain positive contact under a variety of conditions and in numerous product applications. Typically, along with a substantial normal force of the contact beam comes a correspondent increase in insertion force. Although not objectionable on a per-contact beam basis, in a high pin-count configuration the insertion force may become problematic. To afford both high reliability and a high pin-count form, zero insertion force (ZIF) or low insertion force (LIF) options may be supported. In FIGS. 19 and 20, the beams 230 are "cammed" open to provide either zero- or very low-insertion force.

As shown in FIGS. 19 and 20, a cam 250 may be positioned between a cluster of socket contact beams 230. Cam 250 is movable along the socket contact beams 230 between at least two positions. In a first position, as shown in FIG. 19, cam 250 engages ridges 238 formed on surfaces of beams 234 of socket contact beams 230. The ridges 238 may be wedge shaped, for example. As cam 250 is moved along beams 234 of the socket pin cluster, it engages and slides along ridges 238, thereby causing the beams to flex outwardly. Moreover, the sliding interaction of the cam 250 on the surface of beams 234 provides a significant wiping action to further assure good electrical contact. In a second position, as shown in FIG. 20, the cam 250 is located adjacent the housing 210 and does not engage ridges 238. Consequently, cam 250 does not flex beams 234 outward. Rather, the beam 234 resiliently returns to a substantially unflexed position.

The cam mechanism 250 may be used to reduce the insertion force required to mate the package 100 with the mating socket 200. For example, the cam 250 may be placed in the first position to spread the socket contact beams 230 prior to mating with the package pins 130, as shown in FIG. 19. Once the package pins 130 are placed in position within the cluster of socket contact beams 230, the cam 250 may be moved to the second position, thereby permitting the socket contact beams 230 to collapse upon the package pins 130 to form electrical connections. Note that, in accordance with this embodiment, it is not necessary for the post 120 to contact the cam 250. Cam 250 may be moved using externally applied pressure, either by man or machine, to a cam lever 252, shown in FIGS. 11 and 12, for example.

The semiconductor die packages according to the present invention take into account electrical, mechanical, and thermal design considerations to provide the signal integrity useful for present-day semiconductors. Electrical performance considerations are important in the package design as next-generation application-specific integrated circuits (ASICs) and high-end processors are pushing the input/output frequencies toward the microwave frequency band. To support such bandwidths without excessive noise generation and signal degradation, the signal transmission and power distribution through the package parallel those used for microwave signal transmission, yet at densities more than two orders of magnitude greater. In particular, the present package designs both eliminate parasitic inductance in the power distribution network and facilitate satisfactory impedance control through the package.

With regard to cost, the package designs described herein exhibit good material efficiency due to highly dense structure and high material utilization per I/O. Processing costs of assembling the various components of the package product family are low due to the straightforward assembly process and the redundant nature of the cluster structures. The designs permit fully automated assembly. Moreover, the pluggable aspect of the designs advantageously enable population of the most expensive components during the final assembly phase, thereby reducing work in process and lowering inventory costs.

The power and ground planes described herein may be provided in any position of the assembly. The power and ground arrangements described herein and shown, for example, in FIGS. 5–10, may be used in other semiconductor die carriers, such as flip chip carriers, ball grid arrays, etc., may be integrated into the mating socket, or may be used in printed circuit boards or other substrates (such as ceramic laminate, organic laminate, or silicon substrate, for example), to improve electrical performance. The power and ground planes may be provided, for example, above a substrate, as part of the substrate, below a substrate, as part of the die carrier, as part of the mating socket, or any combination of the above. As noted above, the power and/or ground planes 160, 170 may have a coating that electrically insulates them. The coating may be extremely thin to reduce inductance. For example, the power and ground planes may be applied to a mold and encapsulated so as to become part of the die carrier 100 or mating socket 200. Further, the thickness of the ground and power planes may be altered by stacking additional layers. For example, a stacked ground/power/ground structure or a stacked power/ground/power structure may be provided. In general, these power and ground planes may run perpendicular to the signal pins, however, this is not required.

Figure 21:
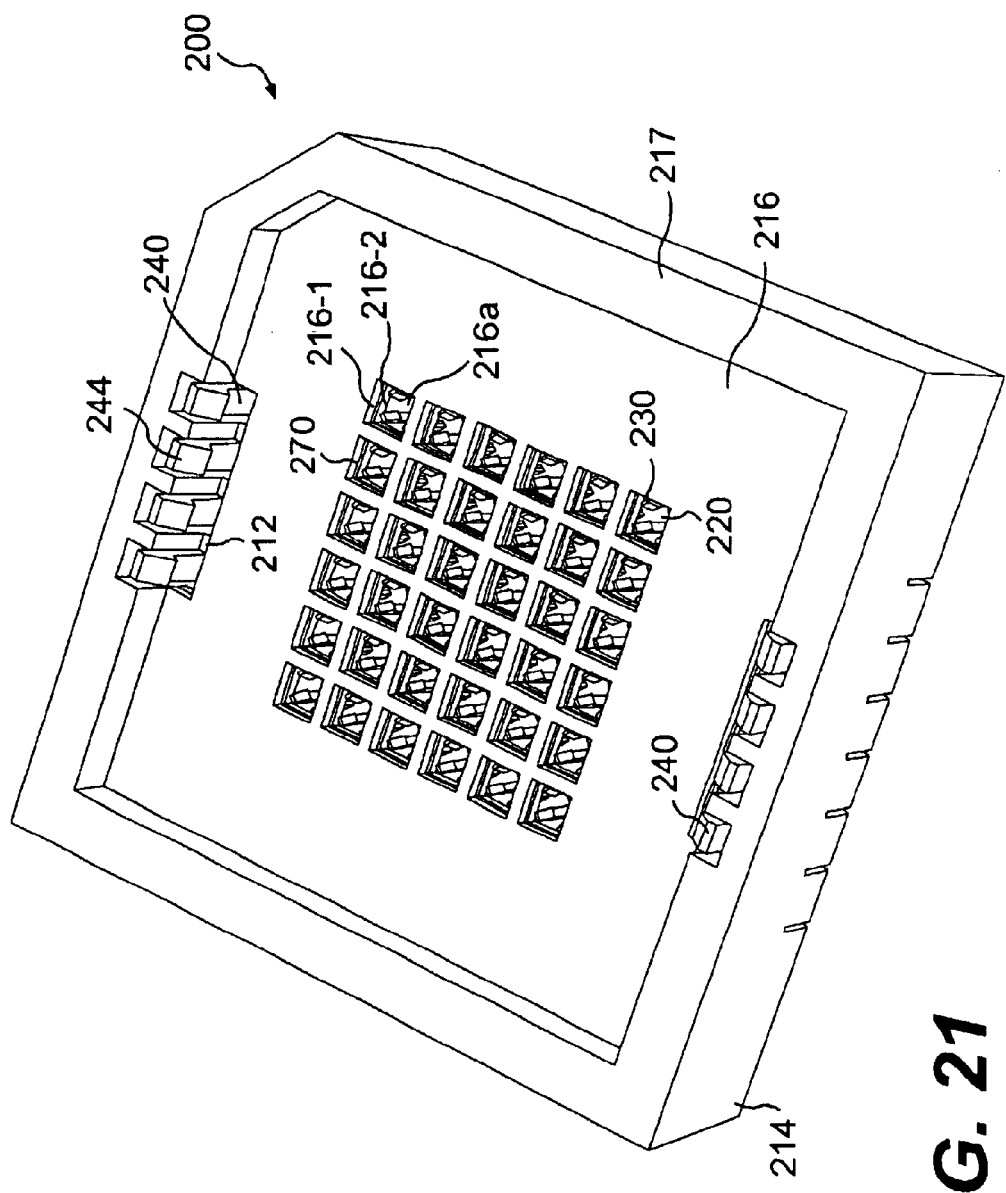
FIG. 21 illustrates an exemplary embodiment of a mating socket in accordance with the present invention.
Figure 22:
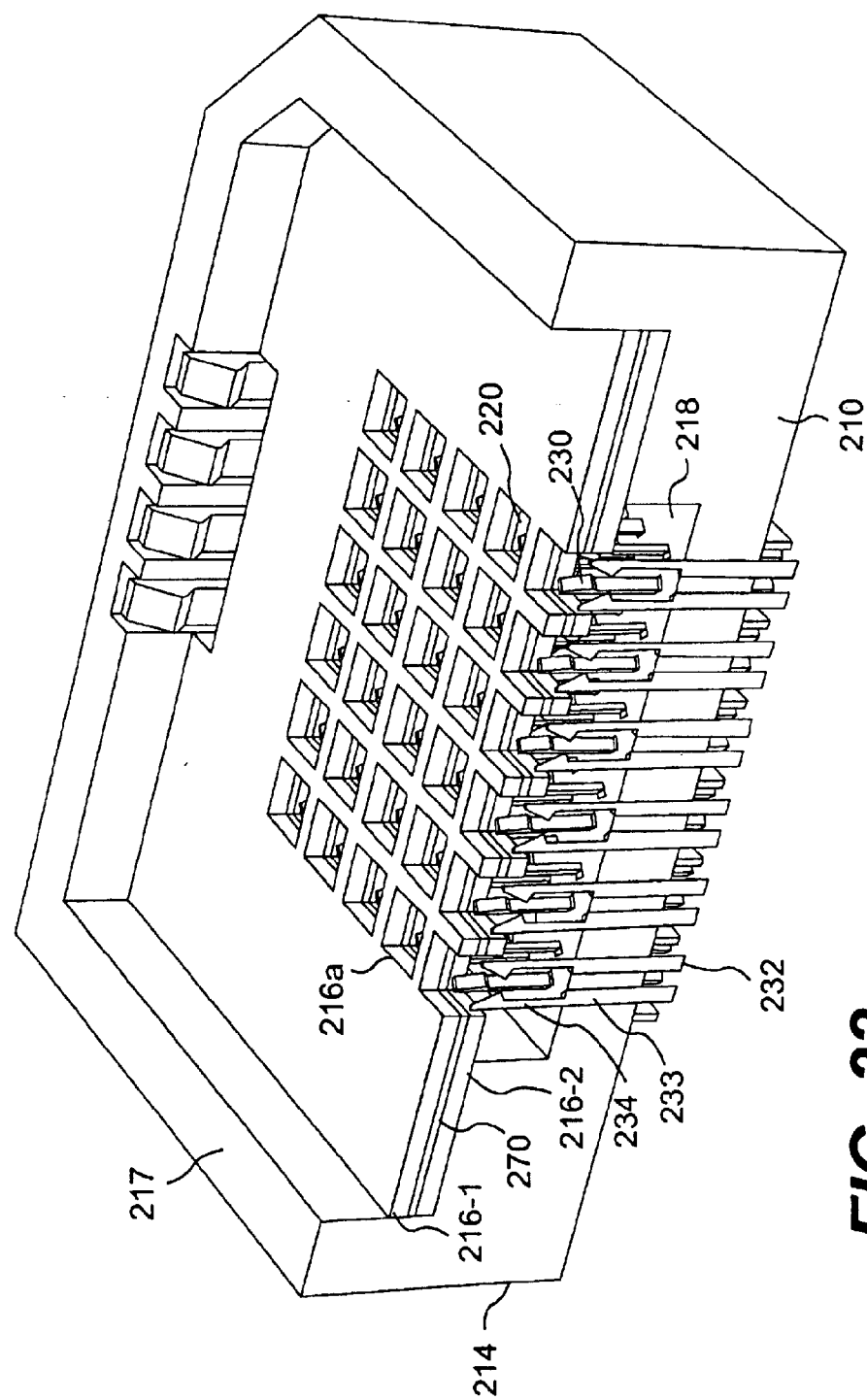
FIG. 22 illustrates a cutaway sectional view of the embodiment of FIG. 22.

FIGS. 21 and 22 illustrate an exemplary embodiment of a mating connector 200 in accordance with the present invention. The mating connector 200 of FIGS. 21 and 22 include many of the features and properties of the embodiment shown in FIGS. 1 and 2, for example, and described above. In general, the mating connector 200 includes a housing 210 having a plurality of sockets 220 and a plurality of electrically-conductive socket beams 230 arranged in the sockets 230. Housing 210 may include a floor portion 216 through which the sockets 220 are provided and walls 217. Ends 232 of socket beams 230 (not shown in FIG. 21) extend from a bottom surface of the housing 210 for electrical connection to a substrate, such as a printed circuit board. As shown in FIGS. 21 and 22, sockets 220 may have a square shape, for example, but other shapes, e.g., circles, ovals, or polygonal shapes, are possible as well. Mating connector 200 further includes power and ground mating pins 240 having resiliently flexible contact beams 244 that flex outwardly when on contact with the power and ground mating contacts 166 during mating between the die carrier and mating socket 200. Power and ground mating pins 240 may be provided in individual passages 212 formed in housing 210. The passages 212 may be provided, at least partially, in walls 217. As shown in FIG. 21, the power and ground mating pins 240 may be provided on opposite sides of housing 200. Of course, the power and ground mating pins 240 may be provided on adjacent sides, on one side only, on three or four sides, or elsewhere.

As shown in more detail in FIG. 22, floor 216 may comprise a first insulative layer 216-1, a ground mesh 270, and a second insulative layer 216-2. The floor 216 includes holes 216a that at least partially define sockets 220 and through which the posts 120 and package pins 130 of the die carrier may be inserted. As noted above, the ground mesh 270 may have a thin coating that insulates the ground mesh 270, including for example on the surfaces that define the holes 216a. Of course, the structure between the first and second insulative layers 216-1 and 216-2 may be a power plane, a combination of adjacent power and ground planes, or a stack of a one or more power and ground planes, as discussed above. Housing 210 includes a base 214 on which the floor 216 may be mounted. A cavity 218 may be defined between the base 214 and the floor 216. At least the flexible contact beams 234 of the socket beams 230 may be provided, or extend through, the cavity 218. Accordingly, at least during mating of the die package 100 and the mating socket 200, the package pins 130 and/or the socket beams 230 will pass through the ground mesh 270. Stabilizer portions 233 of the socket beams may be retained in the base 214, for example, by friction, adhesives, and/or mechanical expedients as noted above. Mating socket 200 of FIGS. 21 and 22 may additionally include other features noted above in connection with the other Figures, but for brevity have not been repeated here.

The mating socket 200 of FIGS. 21 and 22 may be easily manufactured. For example, the base 214 may be molded, e.g., from a liquid crystal polymer material such as VEC-TRA™. Beams 230 and 240 may be inserted into the molded base 214, or molded into the base 214. Floor 216 may be formed separately and attached to the base 214.

Figure 23:
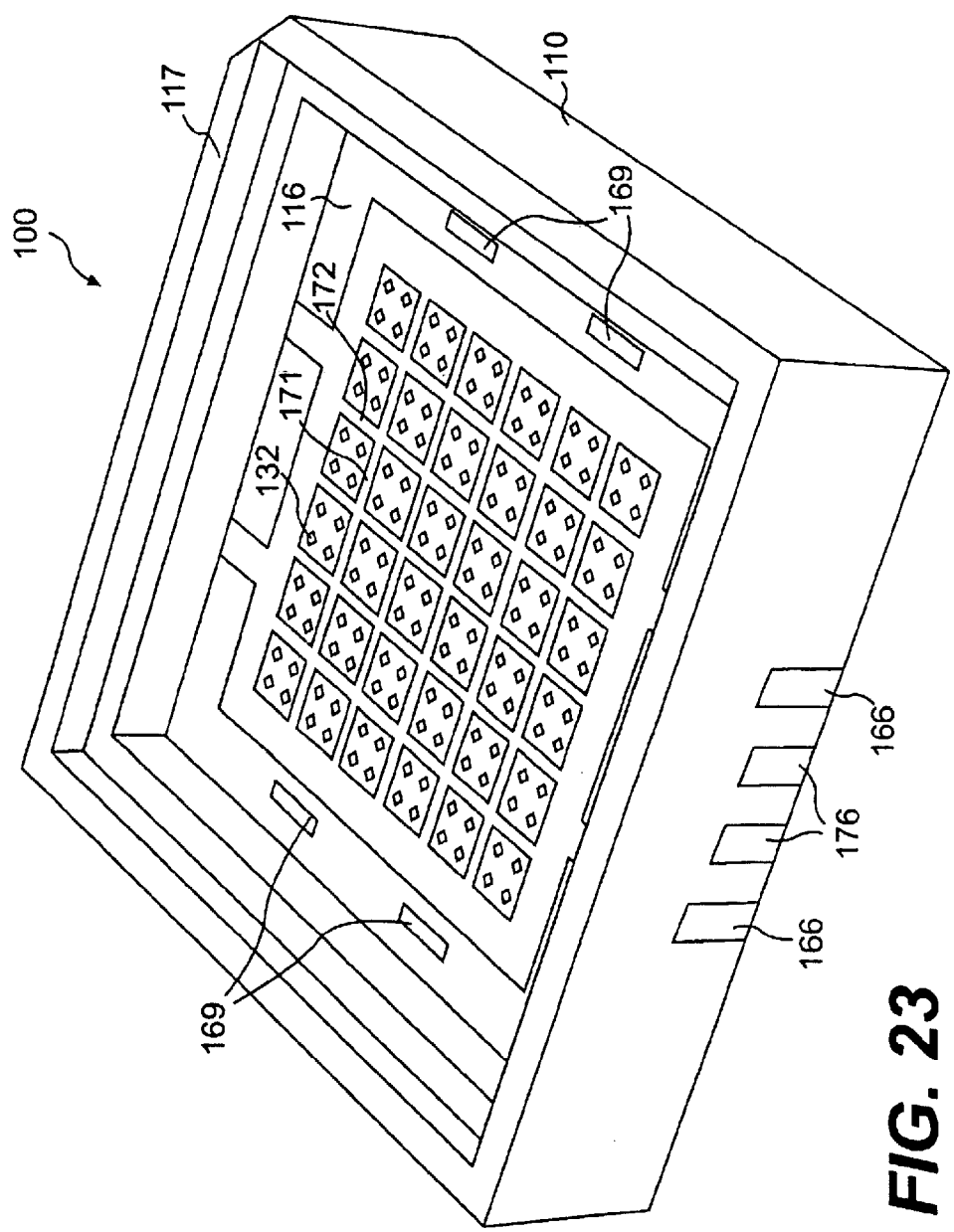
FIG. 23 illustrates an exemplary embodiment of a die carrier in accordance with the present invention.
Figure 24:
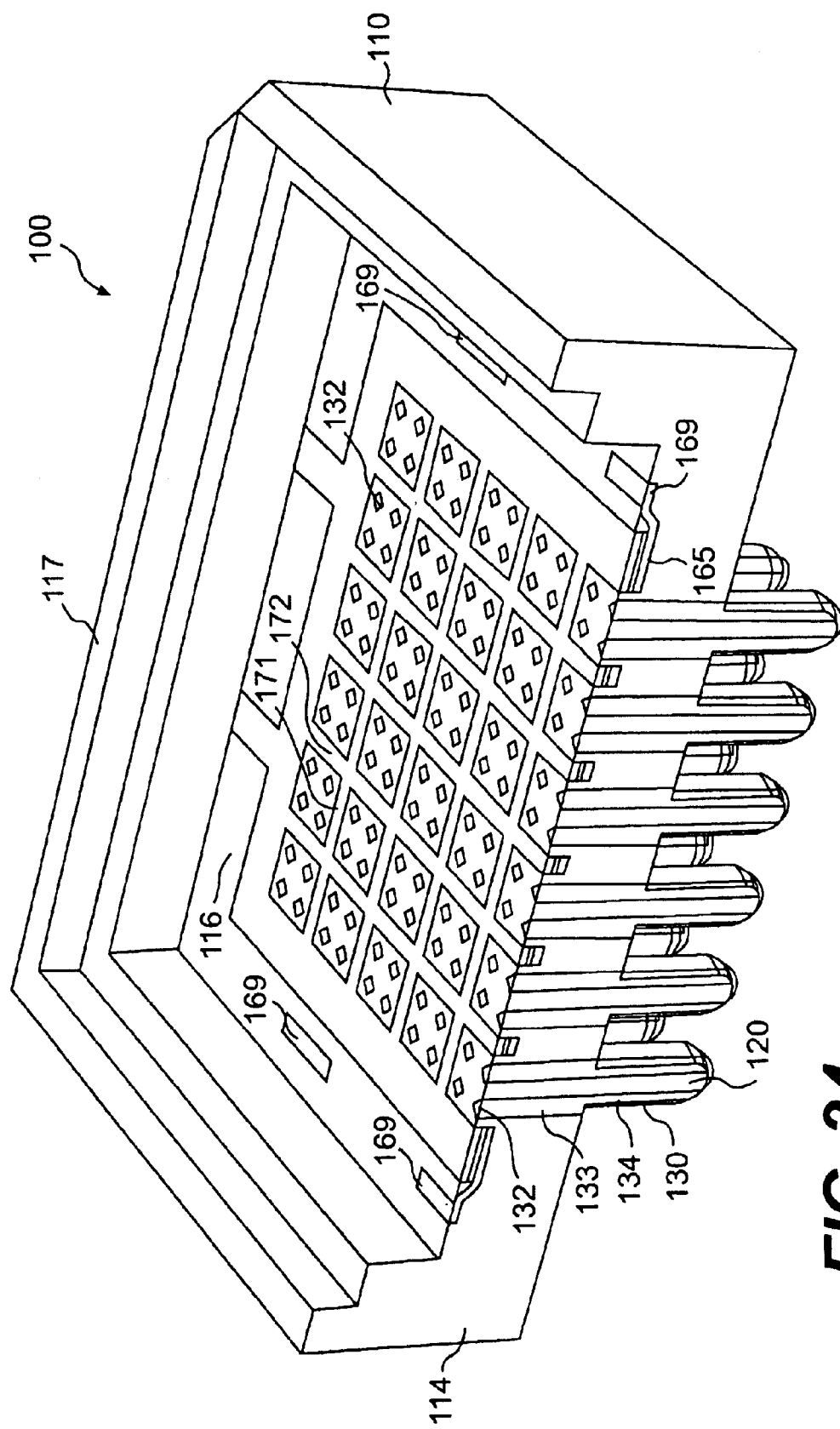
FIG. 24 provides a cutaway sectional view of the embodiment of FIG. 23.

FIGS. 23 and 24 illustrate a further exemplary embodiment of a die package 100 in accordance with the present invention. As shown in FIGS. 23 and 24, the die package 100 is generally similar to that shown in FIGS. 1 and 2, for example, and includes many of the same structures and features. As above, the die package 100 includes a housing 110, a posts 120 extending from a bottom surface of housing 110, and package pins 130 extending along the posts 120 as shown in FIG. 24, for example.

Housing 110 includes a base 114 having a floor 116 and walls 117. The floor 116 and walls 117 define a cavity in which one or more semiconductor dies may be housed. The die(s) may be enclosed within the base 114 with a lid (not shown) and/or encapsulant, as described above. Power contacts 166 and/or ground contacts 176 may be provided at the periphery of base 114. As shown in FIG. 23, the power contacts 166 and ground contacts 176 may be provided on opposite sides of the base 114. As such, the die package 100 may be mated with the mating socket of FIGS. 21 and 22. Of course, as noted above, power and/or ground contacts may be provided on one side, on two adjacent sides, on three or more sides of base 114, elsewhere.

Power plane 160 and ground plane 170 are provided within floor 116. Power plane 160 and ground plane 170 are separated by insulative material. Power plane 160 includes a grid of intersecting rows 165 and columns 167. Extensions 169 of power plane 160 provide access to the surface of floor 116. Ground plane 170 includes a grid design of intersecting rows 171 and columns 172. Ends 132 of package pins 130 are exposed at the surface of floor 116 so that groups of one or more ends 132 (four in the example of FIGS. 23 and 24) are provided between the rows 171 and columns 172. Extensions (not shown) couple the power plane 160 to the power contacts 166. Likewise, extensions (not shown) couple the ground plane 170 to the ground contacts 176. Die package 100 of FIGS. 23 and 24 may additionally include other features noted above in connection with the other Figures, but for brevity have not been repeated here.

It should be borne in mind that the particular embodiments of the present invention are but possible solutions to the complex problem of addressing thermal/mechanical and reliability constraints without sacrificing electrical performance. The flexibility of the design features described herein allows for a wide range of solutions that may vary with individual applications. Additionally, the pluggable alternative now affords systems architects fresh opportunities to partition their products so as to provide new levels of sophistication in systems employing high pin-count devices.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor die package comprising:
   a package housing for holding at least one semiconductor die, a substrate and at least one semiconductor die or more than one substrate and multiple semiconductor die, the housing including a base having a top surface for supporting the at least one semiconductor die, side surfaces, and a bottom surface having a plurality of posts extending therefrom, the base including a plurality of holes formed therethrough from the bottom surface to the top surface;
   a reference voltage plane within the package housing, said plane electrically coupled to a contact that is at least partially exposed externally of the package housing at one of the sides of the base; and
   a plurality of package pins retained in the holes and extending from the bottom surface of the base along the posts.

2. The semiconductor die package according to claim 1, wherein the reference voltage plane comprises a power plane.

3. The semiconductor die package according to claim 2, further comprising a ground plane within the package housing, wherein said ground plane is electrically coupled to a ground plane contact that is at least partially exposed externally of the package housing at one of the sides of the base.

4. The semiconductor die package according to claim 1, wherein the reference voltage plane comprises a ground plane.

5. The semiconductor die package according to claim 4, wherein the reference voltage plane comprises a power plane, wherein said power plane is electrically coupled to a power plane contact that is at least partially exposed externally of the package housing at one of the sides of the base.

6. The semiconductor die package according to claim 4, wherein said ground plane comprises a grid, wherein said package pins extend through the grid.

7. The semiconductor die package according to claim 1, wherein the reference plane is electrically coupled to a plurality of contacts that are at least partially exposed externally of the package housing, at least two of the plurality of contact being exposed at different sides of the base.

8. A semiconductor die package comprising:
   a package housing comprising a base having a top surface for supporting at least one semiconductor die, multiple substrates and multiple semiconductor dies, or a substrate and at least one semiconductor die, the base including a plurality of holes formed therethrough;
   a plurality of electrically-conductive pins retained in the holes and extending from the base externally of the package housing; and
   a ground plane grid in the base, wherein said electrically-conductive pins are electrically insulated from and pass through the ground plane grid.

9. The semiconductor die package according to claim 8, wherein the base of the package housing further comprises a bottom surface opposite the top surface, the bottom surface having a plurality of posts, wherein the electrically-conductive pins extend axially along the posts.

10. The semiconductor die package according to claim 8, further comprising a power plane within said package housing at a periphery or potentially distributed throughout and below the ground plane grid.

11. The semiconductor die package according to claim 8, further comprising a ground plane contact exposed externally of the package housing at a side surface thereof, wherein the ground plane contact contacts said ground plane grid.

12. The semiconductor die package according to claim 8, further comprising multiple ground plane contacts exposed externally of the package housing at a multiple side surfaces thereof, wherein the ground plane contacts contact said ground plane grid.

13. The semiconductor die package according to claim 12, wherein said base has a plurality of indentations along its side surfaces, the multiple ground plane contacts located in the plurality of indentations.

14. A combination comprising:
   a semiconductor die package having (a) a package housing for holding a semiconductor die, the package housing including a base having a top surface for supporting the semiconductor die, side surfaces, and a bottom surface having a plurality of posts extending therefrom, the base including a plurality of holes formed therethrough from the bottom surface to the top surface, (b) a reference voltage plane within the package housing, said plane electrically coupled to a reference voltage contact that is at least partially exposed externally of the package housing at one of the sides of the base, and (c) a plurality of package pins retained in the holes and extending from the bottom surface of the base along the posts, said package pins having a first end adjacent the top surface and a second end; and a mating socket comprising (a) a socket housing having a top surface and a bottom surface, the top surface having a plurality of sockets, each socket sized to receive a post of the die package, (b) a plurality of socket contact beams having first ends located in the sockets and second ends extending from the bottom surface of the socket housing, and (c) at least one mating pin having a first end extending from the top surface of the socket housing and a second end extending from the bottom surface of the socket housing, wherein said package housing is capable of mating with the mating socket such that the posts are received in said sockets, the package pins engage the socket contact beams, and the reference voltage contact engages the mating pin.

15. The combination according to claim 14, wherein the second ends of the socket contact beams and the mating pins are located in substantially the same plane and are adapted for electrical connection to a substrate.

16. The combination according to claim 14, wherein the reference voltage plane comprises a power plane.

17. The combination according to claim 14, wherein the reference voltage plane comprises a ground plane.

18. The combination according to claim 14, wherein the reference voltage plane comprises a grid and wherein said package pins extend through the grid.

19. The combination according to claim 14, wherein the reference plane is electrically coupled to a plurality of contacts that are at least partially exposed externally of the die package housing, at least two of the plurality of contact being exposed at different sides of the base.

20. A combination comprising:

a semiconductor die package including (a) a package housing a base having a top surface for supporting at least one semiconductor die, the base including a plurality of holes formed therethrough, (b) a plurality of electrically-conductive package pins retained in the holes and extending from the base externally of the package housing, (c) and a ground plane grid in the base, wherein said electrically-conductive package pins are electrically insulated from and pass through the ground plane grid; and a mating socket including (a) a socket housing and (b) a plurality of electrically-conductive socket contact beams held in the socket housing, wherein the semiconductor die package and the mating socket connect together such that the package pins engage the socket contact beams to form electrical connections.

21. The combination according to claim 20, wherein the base of the package housing further comprises a bottom surface opposite the top surface, the bottom surface having a plurality of posts, wherein the electrically-conductive pins extend axially along the posts.

22. The combination according to claim 20, further comprising a power plane within said package housing at a periphery of the ground plane grid.

23. The combination according to claim 20, wherein said die package further includes a semiconductor die supported by said base, the semiconductor die electrically connected to the plurality of package pins and the ground plane grid, and a package lid for sealing the semiconductor die in the base.

24. The combination according to claim 23, wherein the die package further comprises solder balls for electrically coupling the semiconductor die to the package pins.

25. The combination according to claim 23, wherein the die package further comprises a substrate on which the semiconductor die is mounted and solder balls for electrically coupling the substrate to the package pins.

26. The combination according to claim 25, wherein the die package further comprising means for electrically coupling the substrate to the semiconductor die.

* * * * *